(12) United States Patent
Wu et al.

(10) Patent No.: US 11,955,442 B2
(45) Date of Patent: Apr. 9, 2024

(54) SEMICONDUCTOR PACKAGE AND METHOD

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW); Chung-Shi Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/174,784

(22) Filed: Feb. 27, 2023

(65) Prior Publication Data

US 2023/0223359 A1 Jul. 13, 2023

Related U.S. Application Data

(63) Continuation of application No. 16/931,992, filed on Jul. 17, 2020, now Pat. No. 11,594,498.

(Continued)

(51) Int. Cl.
*H01L 23/538* (2006.01)
*H01L 21/48* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC .................................................... H01L 23/562
See application file for complete search history.

(56) References Cited

U.S. PATENT DOCUMENTS

| 9,000,584 B2 | 4/2015 | Lin et al. |
| 9,048,222 B2 | 6/2015 | Hung et al. |

(Continued)

FOREIGN PATENT DOCUMENTS

| EP | 3605603 A1 | 5/2020 |
| KR | 20180051611 A | 5/2018 |

(Continued)

*Primary Examiner* — William A Harriston
(74) *Attorney, Agent, or Firm* — Slater Matsil, LLP

(57) ABSTRACT

In an embodiment, a structure includes a core substrate, a redistribution structure coupled, the redistribution structure including a plurality of redistribution layers, the plurality of redistribution layers comprising a dielectric layer and a metallization layer, a first local interconnect component embedded in a first redistribution layer of the plurality of redistribution layers, the first local interconnect component comprising conductive connectors, the conductive connectors being bonded to a metallization pattern of the first redistribution layer, the dielectric layer of the first redistribution layer encapsulating the first local interconnect component, a first integrated circuit die coupled to the redistribution structure, a second integrated circuit die coupled to the redistribution structure, an interconnect structure of the first local interconnect component electrically coupling the first integrated circuit die to the second integrated circuit die, and a set of conductive connectors coupled to a second side of the core substrate.

20 Claims, 29 Drawing Sheets

Related U.S. Application Data

(60) Provisional application No. 63/015,759, filed on Apr. 27, 2020.

(51) Int. Cl.
    *H01L 23/00*    (2006.01)
    *H01L 25/00*    (2006.01)
    *H01L 25/065*    (2023.01)

(52) U.S. Cl.
    CPC ...... *H01L 23/5381* (2013.01); *H01L 23/5383* (2013.01); *H01L 23/5385* (2013.01); *H01L 23/5386* (2013.01); *H01L 24/16* (2013.01); *H01L 25/0652* (2013.01); *H01L 25/50* (2013.01); *H01L 2224/16227* (2013.01); *H01L 2225/06513* (2013.01); *H01L 2225/06541* (2013.01); *H01L 2924/1427* (2013.01); *H01L 2924/1437* (2013.01); *H01L 2924/19103* (2013.01); *H01L 2924/3511* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,761,571 B2 | 9/2017 | Scanlan |
| 2012/0037411 A1 | 2/2012 | Hsu et al. |
| 2017/0062383 A1* | 3/2017 | Yee ............... H01L 23/3675 |
| 2019/0103353 A1 | 4/2019 | Liu et al. |
| 2019/0148329 A1 | 5/2019 | Ting et al. |
| 2020/0006214 A1 | 1/2020 | Tsai et al. |
| 2020/0020638 A1 | 1/2020 | Heo et al. |
| 2020/0075488 A1* | 3/2020 | Wu ...................... H01L 24/96 |
| 2020/0083179 A1* | 3/2020 | Lee .................. H01L 23/5384 |
| 2021/0167051 A1* | 6/2021 | Yu ........................ H01L 25/03 |

FOREIGN PATENT DOCUMENTS

| | | |
|---|---|---|
| KR | 20190055683 A | 5/2019 |
| KR | 20200027419 A | 3/2020 |
| TW | 201843750 A | 12/2018 |
| TW | 201916304 A | 4/2019 |
| TW | 201942986 A | 11/2019 |
| TW | 202002227 A | 1/2020 |
| TW | 202006913 A | 2/2020 |
| WO | 2019132965 A1 | 7/2019 |

\* cited by examiner

SEMICONDUCTOR PACKAGE AND METHOD

PRIORITY CLAIM AND CROSS-REFERENCE

This application is a continuation of U.S. patent application Ser. No. 16/931,992, filed Jul. 17, 2020, which claims the benefit of U.S. Provisional Patent Application No. 63/015,759, filed Apr. 27, 2020, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
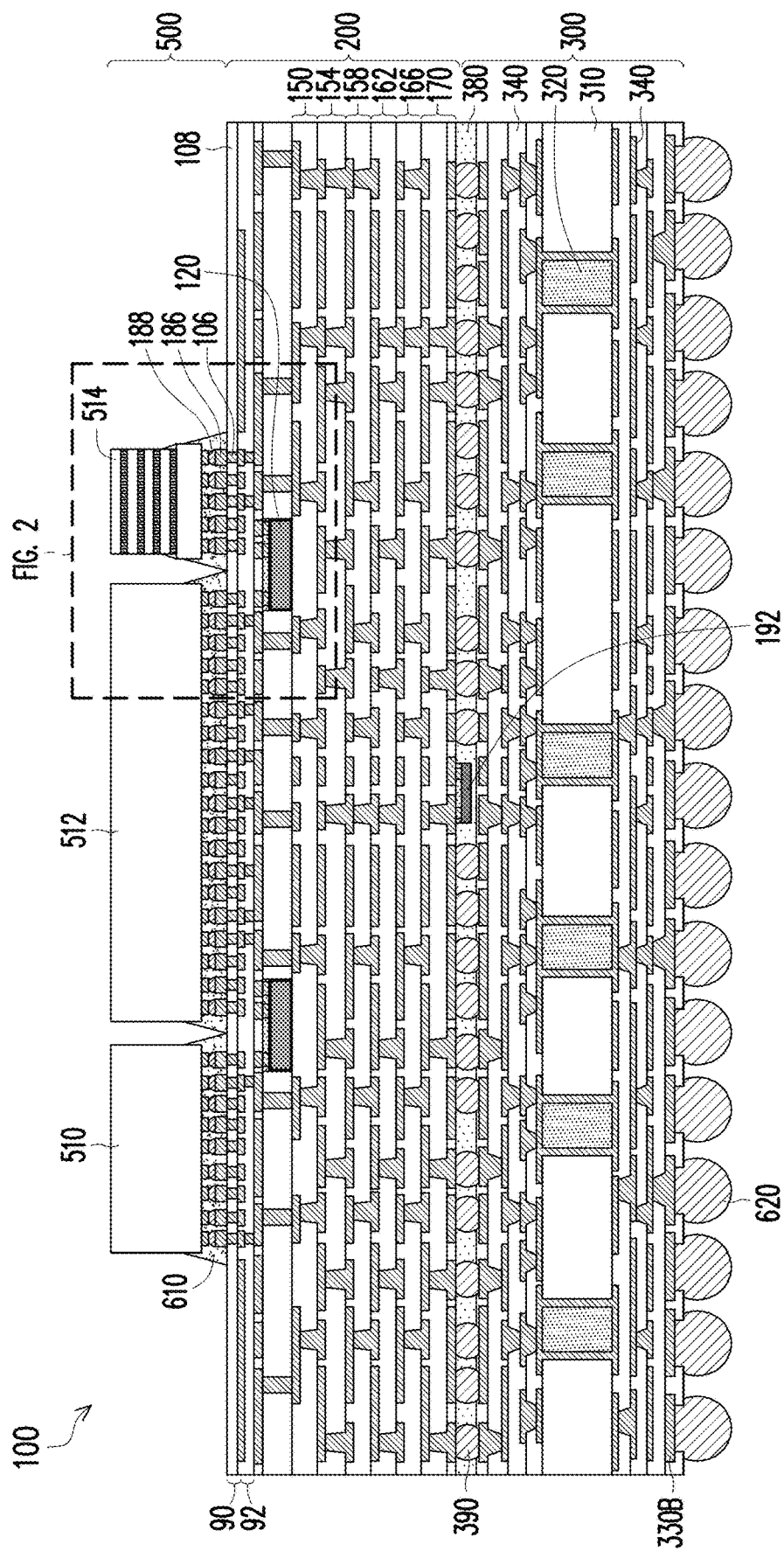
FIG. 1 illustrates a cross-sectional view of a package component in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package component is having one or more integrated circuit dies. In some embodiments, the package component is a system-on-integrated-substrate (SoIS) package. The package component includes a local interconnect component embedded in a redistribution structure. The embedded local interconnect component provides electrical connection between the integrated circuit dies. The embedded local interconnect component increases the communication bandwidth between the integrated circuit dies while maintaining low contact resistance and high reliability. The low contact resistance and high reliability is at least in part due to a solder-free connection between the embedded local interconnect component and the redistribution structure. In some embodiments, other components such as an integrated voltage regulator, an integrated passive device, a static random-access-memory, the like, or a combination thereof can also be embedded in a similar manner as the embedded local interconnect component.

The redistribution structure is connected to the integrated circuit dies and provides electrical connection between the integrated circuit dies and a core substrate and/or between the integrated circuit dies. The core substrate is additionally connected to a set of external conductive features. In such a manner, the integrated circuit dies are electrically connected to the core substrate, and ultimately to the external conductive features, through the core substrate and the redistribution structure.

In accordance with some embodiments, the redistribution structure, the embedded local interconnect component, the core substrate, and the integrated circuit dies, may be individually fabricated and tested prior to assembling the completed package component. This further increases component and board level reliability.

Due to the increased communication bandwidth between the integrated circuit dies provided by the local interconnect components, an interposer is not required between the integrated circuit dies and the redistribution structure. By removing the need for an interposer, the warpage mismatch between the integrated circuit package (including the integrated circuit dies) and the core substrate package (including the core substrate and the redistribution structure) is reduced because the coefficient of thermal expansion (CTE) mismatch between these two package structures is reduced.

In accordance with some embodiments, conductive connectors used to connect the core substrate to the redistribution structures may take the form of, for example, a ball grid array (BGA). Integration of such conductive connectors may provide flexibility in placement for semiconductor devices, such as integrated passive device (IPD) chips, integrated voltage regulators (IVRs), active chips, among other electrical components, to implement system-on-a-chip type of package components, thus reducing fabrication complexity. Such embodiments may also provide a greater amount of flexibility for various other package configurations as well.

Figure 2:
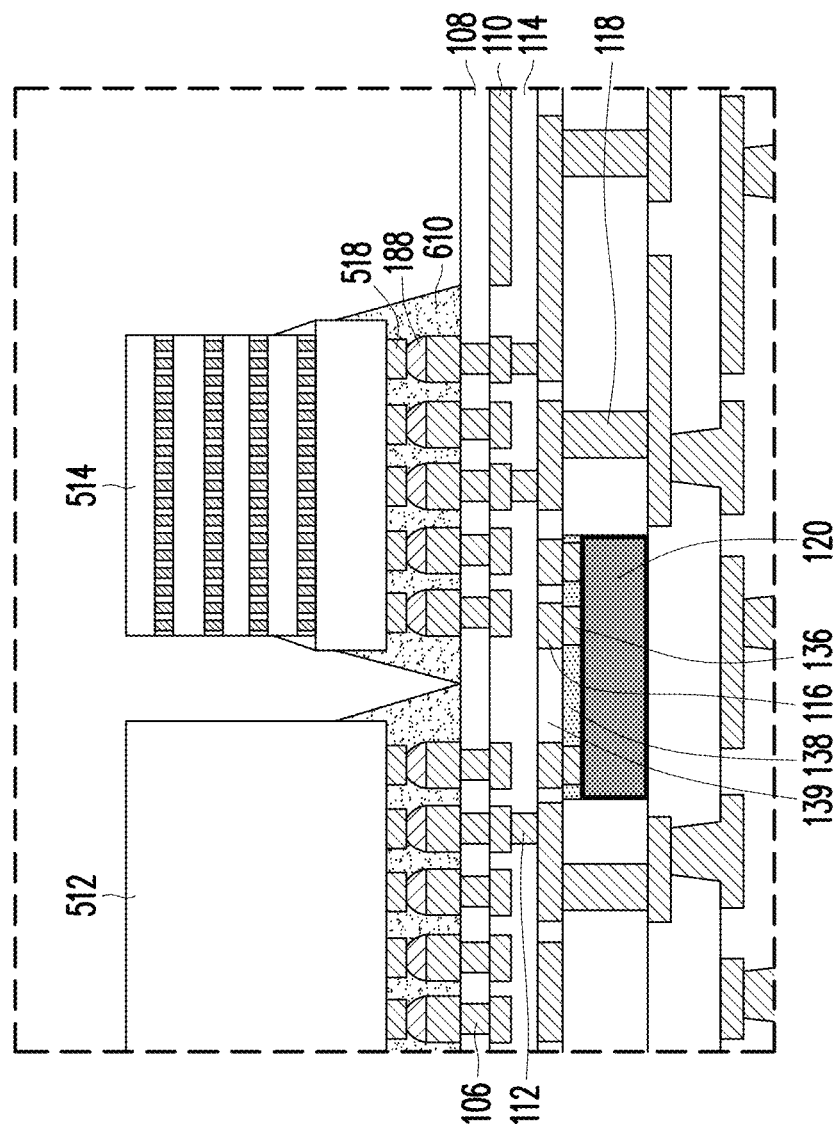
FIG. 2 illustrates a detailed view of a portion of the cross-sectional view of FIG. 1 in accordance with some embodiments.

FIG. 1 illustrates a cross-sectional view of a singulated package component 100 in accordance with some embodiments. FIG. 2 illustrates a detailed view of a portion of the cross-sectional view of FIG. 1 in accordance with some embodiments. The singulated package component 100 includes a semiconductor device (e.g., an integrated circuit package 500), a redistribution structure 200 having one or more redistribution layers, a core substrate 300, and external connectors 620, among other elements. The integrated circuit package 500 may include one or more dies, such as a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In some embodiments, the semiconductor device may be an integrated circuit die.

The integrated circuit package 500 may include a plurality of integrated circuit dies. As shown, the integrated circuit package 500 includes one or more logic dies 512, one or more memory dies 514, and one or more input/output (I/O) dies 516 (not shown in FIG. 1, but see FIG. 3) for illustrative purposes. The integrated circuit dies may be formed in one or more wafers, which may include different device regions that are singulated in subsequent steps. The integrated circuit dies may be packaged with other similar or different integrated circuit dies using known manufacturing techniques. In some embodiments, the integrated circuit dies 512, 514, and 516 are formed using similar processes and techniques as described below in reference to FIG. 7.

In some embodiments, one or more of the integrated circuit dies 512, 514, and 516 may be stacked devices that include multiple semiconductor substrates. For example, the memory die 514 may be a memory device such as a hybrid memory cube (HMC) module, a high bandwidth memory (HBM) module, or the like that includes multiple memory dies. In such embodiments, the memory die 514 includes multiple semiconductor substrates interconnected by through-substrate vias (TSVs). Each of the semiconductor substrates may (or may not) have an interconnect structure.

The dies 512, 514, and 516 have bond pads 518 that are bonded to the conductive connectors 188. In some embodiments, the bond pads 518 are made of a conductive material and may be similar to the conductive lines (see, e.g., conductive lines 110) described below.

Conductive connectors 188 provide electrical connection between the redistribution structure 200 and the integrated circuit package 500. An underfill 610 may be included to securely bond the integrated circuit package 500 to the redistribution structure 200 and provide structural support and environmental protection.

As discussed in greater detail below, the redistribution structure 200 provides electrical pathing and connection between the integrated circuit package 500 and a core substrate 300 by way of conductive connectors 390. In some embodiments, the redistribution structure 200 has one or more redistribution layers comprising metallization patterns, comprising, for example, conductive lines 110 and 116 and conductive vias 106 and 112, and dielectric layers 108 and 114 separating adjacent layers of the conductive lines 110 and 116.

As discussed in greater detail below, the redistribution structure 200 includes one or more local interconnect components 120. The local interconnect components 120 provide electrical routing and connection between the integrated circuit dies 512, 514, and 516 of the integrated circuit package 500 and may be referred to as interconnecting dies 120. The local interconnect components 120 increase the communication bandwidth between the integrated circuit dies 512-516 while maintaining low contact resistance and high reliability. The low contact resistance and high reliability is at least in part due to a solder-free connection between the embedded local interconnect component and the redistribution structure. As illustrated in FIGS. 1 and 2, the local interconnect components 120 are connected to metallization patterns 116 of the redistribution structure 200 by solder-free conductive connectors 136. In some embodiments, the local interconnect components 120 are embedded within the redistribution structure 200 by copper-to-copper bonding. In some embodiments, the local interconnect components 120 are embedded within the redistribution structure 200 by hybrid bonding.

Due to the increased communication bandwidth between the integrated circuit dies provided by the local interconnect components, an interposer is not required between the integrated circuit dies and the redistribution structure. By removing the need for an interposer, the warpage mismatch between the integrated circuit package (including the integrated circuit dies) and the core substrate package (including the core substrate and the redistribution structure) is reduced because the coefficient of thermal expansion (CTE) mismatch between these two package structures is reduced.

The redistribution structure 200 may be electrically and mechanically attached to the core substrate 300. The core substrate 300 may include a central core 310, with conductive vias 320 extending through the central core 310, and additional optional redistribution structures 340 along opposing sides of the central core 310. Generally, the core substrate 300 provides structural support for the component package, as well as providing electrical signal routing between the integrated circuit package and the external connectors 80.

Encapsulant 380 may be included between the redistribution structure 200 and the core substrate 300 to securely bond the associated elements and provide structural support and environmental protection.

Figure 3:
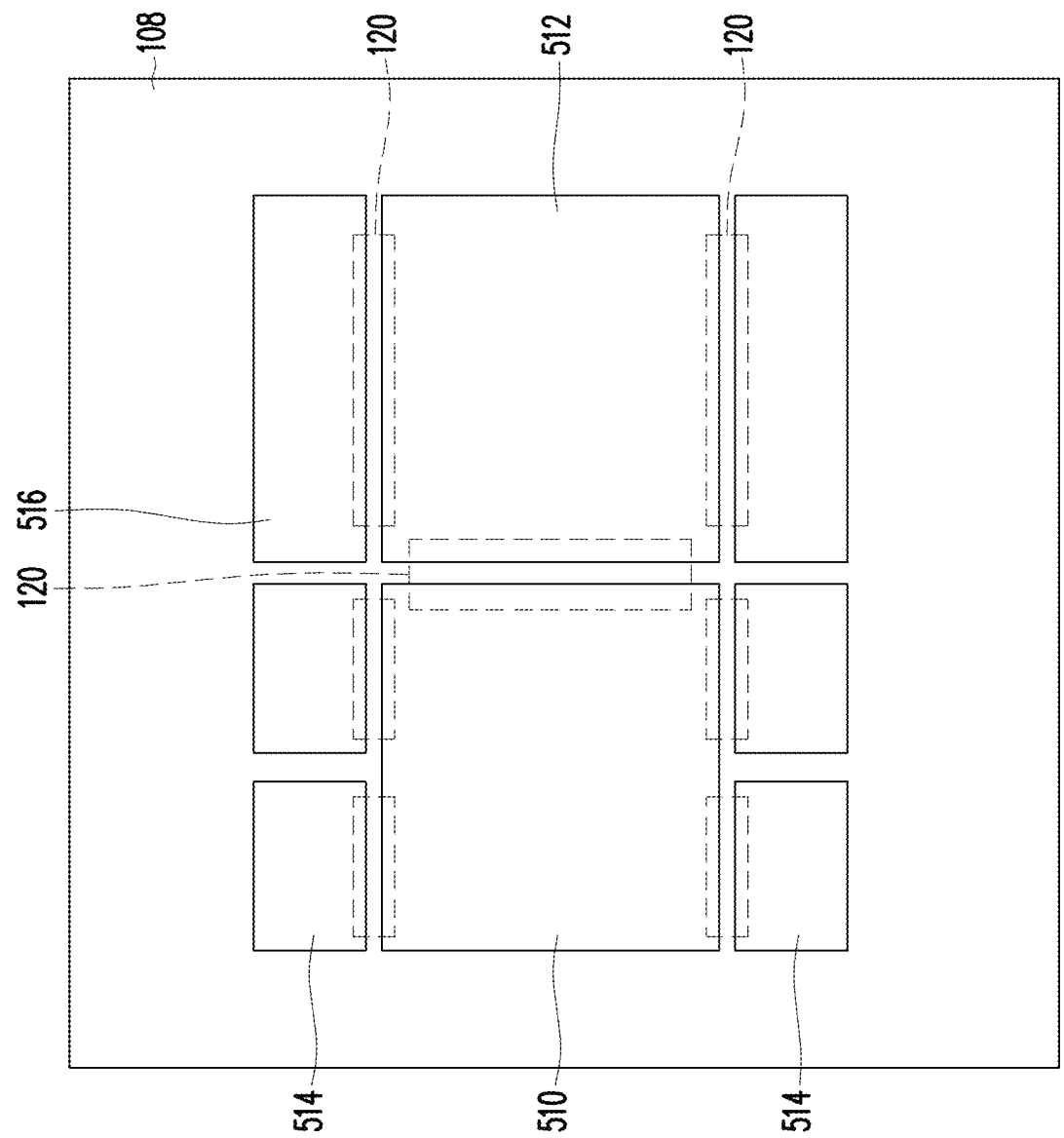
FIG. 3 illustrates a plan view of the package component in accordance with some embodiments.

FIG. 3 illustrates a plan view of the package component in accordance with some embodiments. The embodiment illustrated in FIG. 3 includes two logic dies 512, four memory dies 514, two I/O dies 516, and seven local interconnect components 120. In this embodiment, each of the memory dies 514 and I/O dies 516 are connected to at least one of the logic dies 512 by a respective local interconnect component 120. In addition, the two logic dies are connected together by a local interconnect component 120. Other embodiments may include more or less logic dies 512, memory dies 514, I/O dies 516, and local interconnect components 120. In some embodiments, each of the integrated circuit dies are connected to each adjacent integrated circuit die by a local interconnect component.

FIGS. 4 through 16 illustrates various intermediate stages in fabricating a redistribution structure 200 (see FIG. 16), in accordance with some embodiments. A first package region 101A and a second package region 101B are illustrated where each package region is eventually singulated from other package regions. The illustrations of the individual features have been simplified in FIGS. 4 through 16 for ease of illustration.

Figure 4:
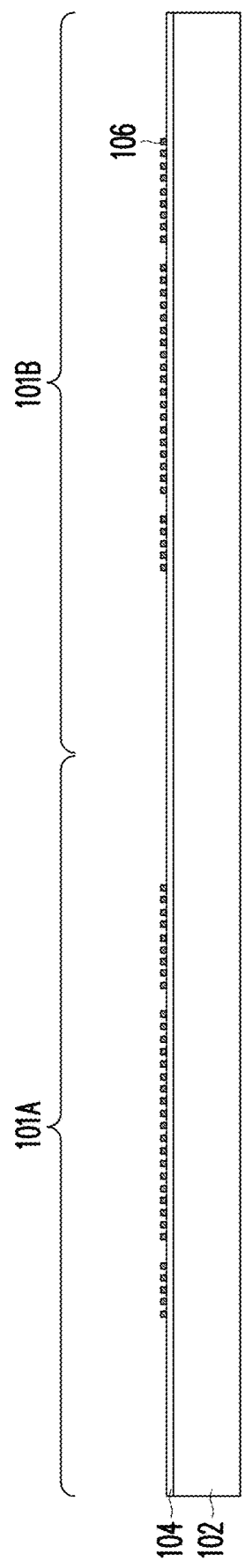
FIGS. 4 through 18 and 21 through 23 illustrate cross-sectional views of intermediate steps during a process for forming a package component in accordance with some embodiments.

Referring first to FIG. 4, a carrier substrate 102 is provided, a release layer 104 is formed on the carrier substrate 102, and conductive vias 106 are formed over the release layer 104. The carrier substrate 102 may be a glass carrier substrate, a ceramic carrier substrate, or the like. The carrier substrate 102 may be a wafer, such that multiple redistribution structures can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and be substantially planar within process variations.

In FIG. 4, conductive vias 106 are formed on the release layer 104. The conductive vias 106 may subsequently be exposed by a carrier debonding process and used to provide connection the redistribution structure 200. Conductive vias 106 form the metallization pattern for redistribution layer 90. As an example to form the conductive vias 106, a seed layer (not shown) is formed over the release layer 104. In some embodiments, the seed layer is a metal layer, which may be a single layer or a composite layer comprising a plurality of sub-layers formed of different materials. The seed layer may be, for example, a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The patterning forms openings through the photoresist to expose the seed layer, where the openings in the photoresist correspond to the conductive vias 106. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive vias 106. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 5:
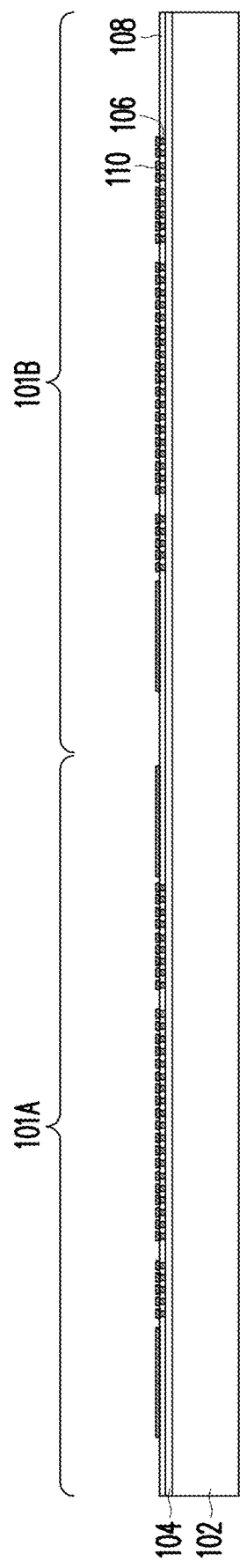

In FIG. 5, a dielectric layer 108 is formed on and around the conductive vias 106 and conductive lines 110 are formed on the dielectric layer 108 and conductive vias 106 in accordance with some embodiments. After formation, the dielectric layer 108 surrounds the conductive vias 106. The dielectric layer 108 may provide electrical isolation and environmental protection. The dielectric layer 108 and metallization pattern, including conductive vias 106, form a redistribution layer 90. The dielectric layer 108 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like; or a combination thereof. The dielectric layer 108 may be formed, for example, by spin coating, lamination, chemical vapor deposition (CVD), or the like. The dielectric layer 108 may have an upper surface that is substantially level within process variations. In some embodiments, the dielectric layer is formed to have a thickness in a range from 2 μm to 50 μm.

After the dielectric layer 108 is formed, the conductive lines 110 are formed on the dielectric layer 108 and the conductive vias 106. As an example to form the conductive lines 110, a seed layer (not shown) is formed over the dielectric layer 108 and the conductive vias 106. In some embodiments, the seed layer is a metal layer, which may be a single layer or a composite layer comprising a plurality of sub-layers formed of different materials. The seed layer may be, for example, a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The patterning forms openings through the photoresist to expose the seed layer, where the openings in the photoresist correspond to the conductive lines 110. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive vias 106. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 6:
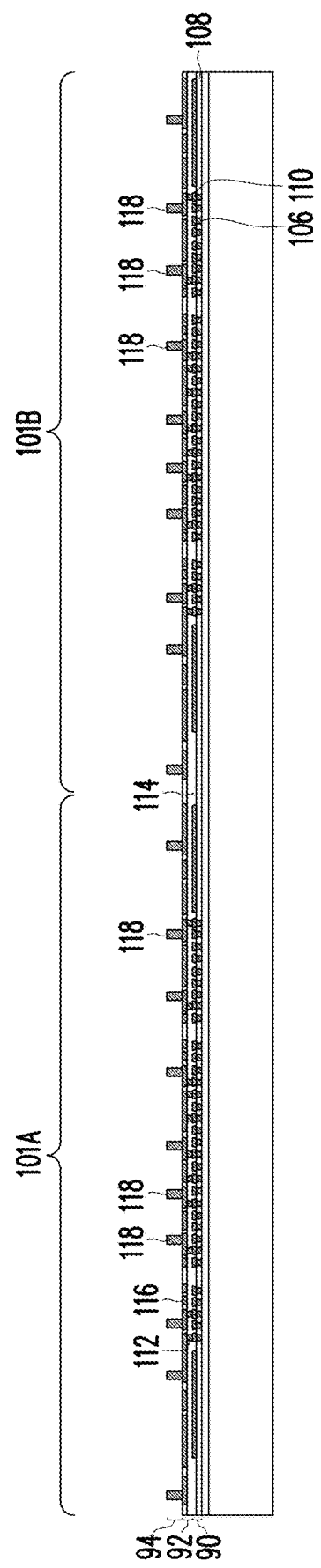

In FIG. 6, conductive vias 112 are formed on the conductive lines 110 and a dielectric layer 114 is formed on and around the conductive vias 112 and conductive lines 110 in accordance with some embodiments. Conductive lines 110 and conductive vias 112, together, form the metallization pattern for redistribution layer 92. The conductive vias 112 may be similar to the conductive vias 106 described above and the description is not repeated herein. The dielectric layer 114 may be similar to the dielectric layer 108 described above and the description is not repeated herein. The dielectric layer 114 and metallization pattern, including conductive vias 112 and conductive lines 110, form a redistribution layer 92. In some embodiments, the conductive vias 106 and 112 have widths in a range from 2 μm to 50 μm.

Further in FIG. 6, conductive lines 116 and conductive vias 118 are formed. The conductive lines 116 are formed over and connected to the conductive vias 112 and the conductive vias 118 are formed over and connected to the conductive lines 116. Conductive lines 116 and conductive vias 118, together, form the metallization pattern for redistribution layer 94. The conductive lines 116 and conductive vias 118 may be similar to the conductive lines 110 and conductive vias 106 described above and the description is not repeated herein. In some embodiments, the conductive vias 118 have a greater height than the conductive vias 106 and 112 as the conductive vias 118 act as a through dielectric vias adjacent the subsequently attached local interconnect components 120. In some embodiments, the conductive vias 118 have widths in a range from 5 μm to 100 μm.

Figure 7:
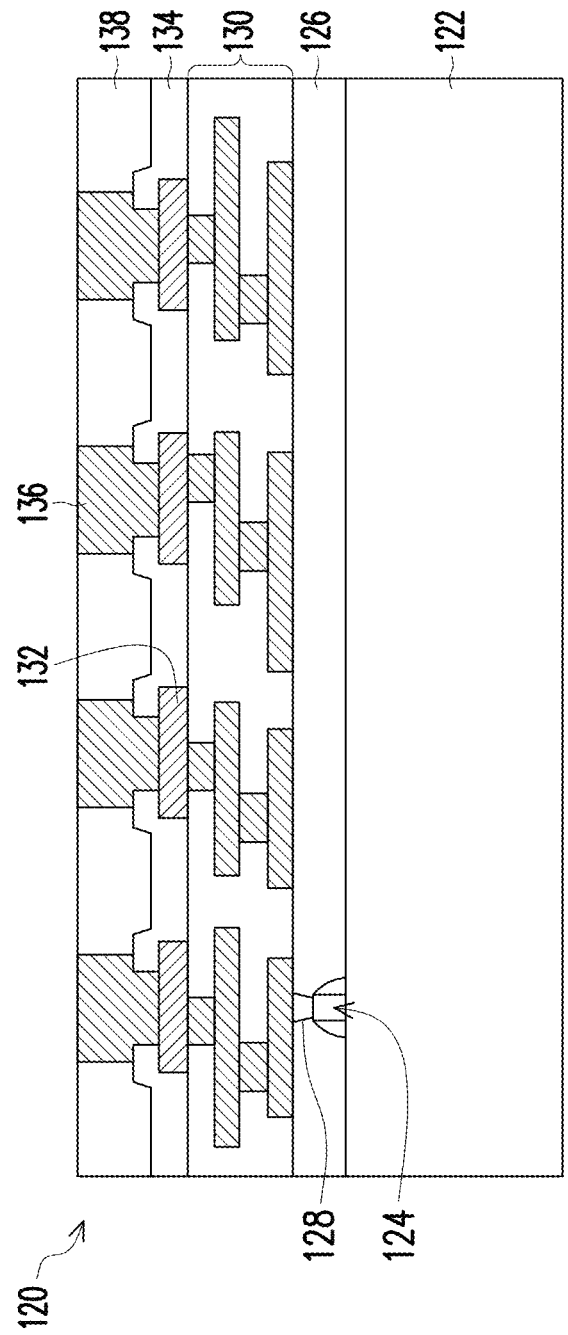

FIG. 7 illustrates a cross-sectional view of a local interconnect component 120 in accordance with some embodiments. The local interconnect component 120 will be embedded in subsequent processing in the redistribution structure 200.

The local interconnect component 120 may be formed in a wafer, which may include different device regions that are singulated in subsequent steps to form a plurality of local interconnect components. The local interconnect component 120 may be processed according to applicable manufacturing processes to form dies. For example, the local interconnect component 120 includes a substrate 122, such as silicon, doped or undoped, or an active layer of a semiconductor-on-insulator (SOI) substrate. The substrate 122 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the substrate 122 may be made up of a ceramic material, a polymer film, a magnetic material, the like or a combination thereof. Other substrates, such as multi-layered or gradient substrates, may also be used. The substrate 122 has an active surface (e.g., the surface facing upwards in FIG. 7), sometimes called a front side, and an inactive surface (e.g., the surface facing downwards in FIG. 7), sometimes called a back side.

In some embodiments, the local interconnect component 120 may include active or passive devices. In some embodiments, the local interconnect component 120 may be free of active or passive devices and may only be used for routing of electrical signals. In the embodiments that includes active or passive devices, devices (represented by a transistor) 124 may be formed at the front surface of the semiconductor substrate 122. The devices 124 may be active devices (e.g., transistors, diodes, etc.), capacitors, resistors, inductors, etc. An inter-layer dielectric (ILD) 126 is over the front surface of the semiconductor substrate 122. The ILD 126 surrounds and may cover the devices 124. The ILD 126 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 128 extend through the ILD 126 to electrically and physically couple the devices 124. For example, when the devices 124 are transistors, the conductive plugs 128 may couple the gates and source/drain regions of the transistors. The conductive plugs 128 may be formed of tungsten, cobalt, nickel, copper, silver, gold, aluminum, the like, or combinations thereof. An interconnect structure 130 is over the ILD 126 and conductive plugs 128. The interconnect structure 130 interconnects the devices 124 and/or provides electrical routing and connection between die connectors 136. The interconnect structure 130 may be formed by, for example, metallization patterns in dielectric layers on the ILD 126 using for example a damascene process. The metallization patterns include metal lines and vias formed in one or more low-k dielectric layers. In the embodiments, where devices 124 are included, the metallization patterns of the interconnect structure 130 are electrically coupled to the devices 124 by the conductive plugs 128. Although the interconnect structure 130 is illustrated with only two layers of conductive vias and two layers of conductive lines, in some embodiments, more or less layers of conductive vias and of conductive lines may be included as needed. For example, because the local interconnect component 120 is being used for electrical connection between the dies of the integrated circuit package 500, the interconnect structure 130 of the local interconnect component 120 will often have many more interconnect layers to accommodate this electrical connection.

The local interconnect component 120 further includes pads 132, such as aluminum pads, to which external connections are made. The pads 132 are on the active side of the local interconnect component 120, such as in and/or on the interconnect structure 130. One or more passivation films 134 are on the local interconnect component 120, such as on portions of the interconnect structure 130 and pads 132. Openings extend through the passivation films 134 to the pads 132. Die connectors 136, such as conductive pillars (for example, formed of a metal such as copper), extend through the openings in the passivation films 134 and are physically and electrically coupled to respective ones of the pads 132. The die connectors 136 may be formed by, for example, plating, or the like. The die connectors 136 electrically couple the respective integrated circuits of the local interconnect component 120.

Optionally, solder regions (e.g., solder balls or solder bumps) may be disposed on the pads 132. The solder balls may be used to perform chip probe (CP) testing on the local interconnect component 120. CP testing may be performed on the local interconnect component 120 to ascertain whether the local interconnect component 120 is a known good die (KGD). Thus, only local interconnect components 120, which are KGDs, undergo subsequent processing are packaged, and dies, which fail the CP testing, are not packaged. After testing, the solder regions may be removed in subsequent processing steps.

A dielectric layer 138 may (or may not) be on the active side of the local interconnect component 120, such as on the passivation films 134 and the die connectors 136. The dielectric layer 138 laterally encapsulates the die connectors 136, and the dielectric layer 138 is laterally coterminous with the local interconnect component 120. Initially, the dielectric layer 138 may bury the die connectors 136, such that the topmost surface of the dielectric layer 138 is above the topmost surfaces of the die connectors 136. In some embodiments where solder regions are disposed on the die connectors 136, the dielectric layer 138 may bury the solder regions as well. Alternatively, the solder regions may be removed prior to forming the dielectric layer 138.

The dielectric layer 138 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 138 may be formed, for example, by spin coating, lamination, chemical vapor deposition (CVD), or the like. In some embodiments, the die connectors 136 are exposed through the dielectric layer 138 during formation of the local interconnect component 120. Exposing the die connectors 136 may remove any solder regions that may be present on the die connectors 136.

In some embodiments, the die connectors 136 and the dielectric layer 138 may be used in a hybrid bonding configuration to bond the local interconnect component 120 to a structure. In other embodiments, the local interconnect component 120 is bonded in a metal-to-metal bonding configuration (e.g., copper-to-copper bonding). In some embodiments, the die connectors 136 have a pitch in a range from 20 µm to 80 µm.

Figure 8:
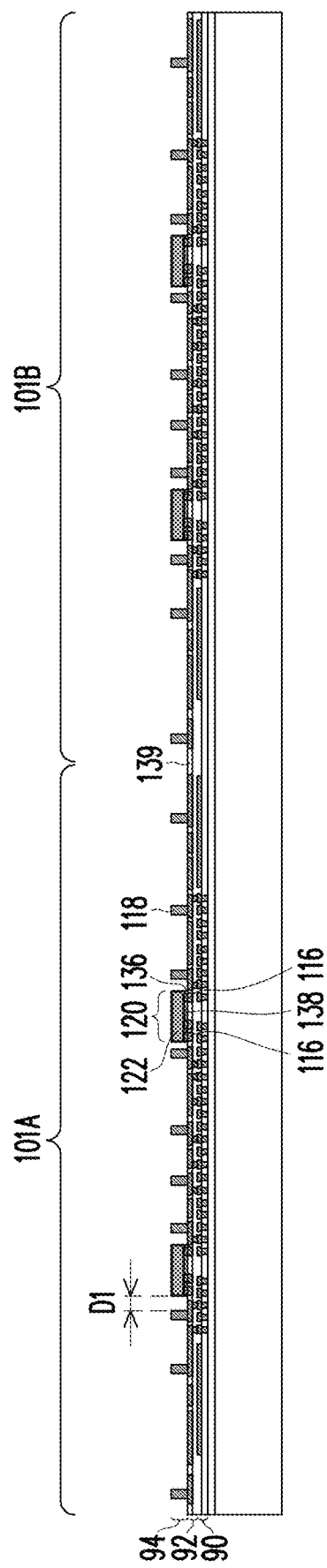

In FIG. 8, the local interconnect components 120 are bonded to the conductive lines 116 of the redistribution structure 200. In some embodiments, the local interconnect components 120 are bonded by hybrid bonding. In the hybrid bonding embodiments, a dielectric layer 139 is formed at least laterally surrounding the conductive lines 116. The dielectric layer 139 may be formed before or after the conductive lines 116. The dielectric layer 139 may be similar to the dielectric layer 138 and the description is not repeated herein.

To achieve the hybrid bonding, the local interconnect components 120 and the conductive lines 116 of the redistribution structure 200 are first pre-bonded to by their insulating layers (e.g., 138 and 129) by lightly pressing the local interconnect components 120 and the conductive lines 116 of the redistribution structure 200 together.

After all of the local interconnect components 120 are pre-bonded, a heating process is performed to cause the inter-diffusion of the conductive material (e.g., copper) of the die connectors 136 and the conductive lines 116. In accordance with some embodiments of the present disclosure, one or both of insulating layers 138 and 139 comprise a polymer. Accordingly, the annealing temperature is lowered to lower than about 230° C. in order to avoid the damage of the insulating layers. For example, the annealing temperature may be in the range between about 150° and about 230° C. The annealing time may be between about 1 hours and 3 hours.

Through the hybrid bonding, the die connectors 136 and the conductive lines 116 are bonded to each other through metal-to-metal bonding, such as copper-to-copper bonding to form a bonding joint. The insulating layers 138 of the local interconnect components 120 are also bonded to the insulating layer 139, with bonds formed therebetween. For example, the atoms (such as oxygen atoms) in one of the insulating layers form chemical or covalence bonds (such as O—H bonds) with the atoms (such as hydrogen atoms) in the other one of the insulating layers. The resulting bonds between the insulating layers are dielectric-to-dielectric bonds, which may be inorganic-to-polymer, polymer-to-polymer, or inorganic-to-inorganic bonds in accordance with various embodiments. Furthermore, the surface insulating layers 138 and 139 may be different from each other (for example, with one being a polymer layer and the other being an inorganic layer), and hence there may be two types of inorganic-to-polymer, polymer-to-polymer, and inorganic-to-inorganic bonds existing simultaneously in the same package.

In some embodiments, the conductive vias 118 are spaced apart from the local interconnect components 120 by a distance D1. In some embodiments, the distance D1 is at least 5 µm. In some embodiments, the distance D1 is in a range from 5 µm to 2000 µm.

Figure 9:
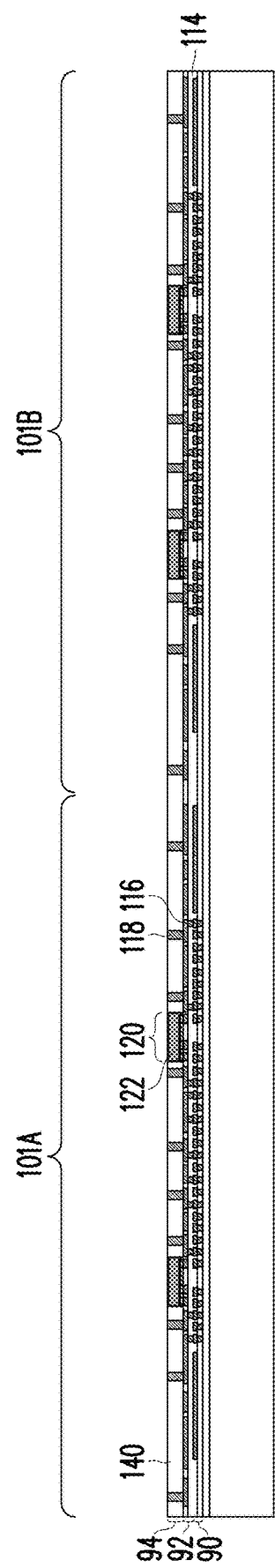

In FIG. 9, a dielectric layer 140 is formed on and around the conductive vias 118 and the local interconnect components 120 in accordance with some embodiments. The dielectric layer 140 encapsulates the local interconnect components 120 and the conductive vias 118. The dielectric layer 140, the local interconnect components 120, and metallization pattern, including conductive vias 118 and conductive lines 116, form a redistribution layer 94. The dielectric layer 140 (and the dielectric layers of redistribution layers 154, 158, 162, 166, and 170) may be a different material than the dielectric layers 108 and 114.

It has been observed that by spacing apart the conductive vias 118 from the local interconnect 120 by at least 5 µm, the formation of a dielectric layer 140 is improved. With D1 being at least 5 µm allows for the dielectric layer 140 to be formed more uniformly (e.g., without voids, gaps, and/or seams) between the local interconnect 120 and the conductive vias 118, which improves the dielectric properties of the dielectric layer 140. By improving the coverage and/or uniformity of the dielectric layer 140, the electrical performance of the package structure is improved.

In some embodiments, the dielectric layer 140 may be formed of pre-preg, Ajinomoto Build-up Film (ABF), resin coated copper (RCC), molding compound, polyimide, photo-imagable dielectric (PID), epoxy, or the like, and may be applied by compression molding, transfer molding, or the like. The encapsulant may be applied in liquid or semi-liquid form and then subsequently cured. In some embodiments, the dielectric layer 140 is formed over the dielectric layer 114 such that the conductive lines 110, conductive vias 118, and local interconnect components are buried or covered, and a planarization process is then performed on the dielectric layer 140 to expose the conductive vias 118 and the backsides of the substrates 122 of the local interconnect components 120. Topmost surfaces of the dielectric layer 140, conductive vias 118, and the substrates 122 of the local interconnect components 120 are substantially level (e.g., planar) within process variations after the planarization process. The planarization process may be, for example, a chemical-mechanical polish (CMP). In some embodiments, the dielectric layer 140 may comprise other materials, such as silicon oxide, silicon nitride, or the like. After the planarization process (if any), the thickness of the local interconnect components is in a range from 10 µm to 100 µm. In some embodiments, the substrates 122 of the local interconnect components 120 have a thickness in a range from 2 µm to 30 µm and the die connectors 136 have a height in a range from 1 µm to 20 µm.

The local interconnect components 120 provide electrical connection between the subsequently attached integrated circuit dies (e.g., 512, 514, and 516). The embedded local interconnect components 120 increases the communication bandwidth between the integrated circuit dies while maintaining low contact resistance and high reliability. The low contact resistance and high reliability is at least in part due to a solder-free connection between the embedded local interconnect component and the redistribution structure. In some embodiments, other components such as an integrated voltage regulator, an integrated passive device, a static random-access-memory, the like, or a combination thereof can also be embedded in a similar manner as the embedded local interconnect component.

Figure 10:
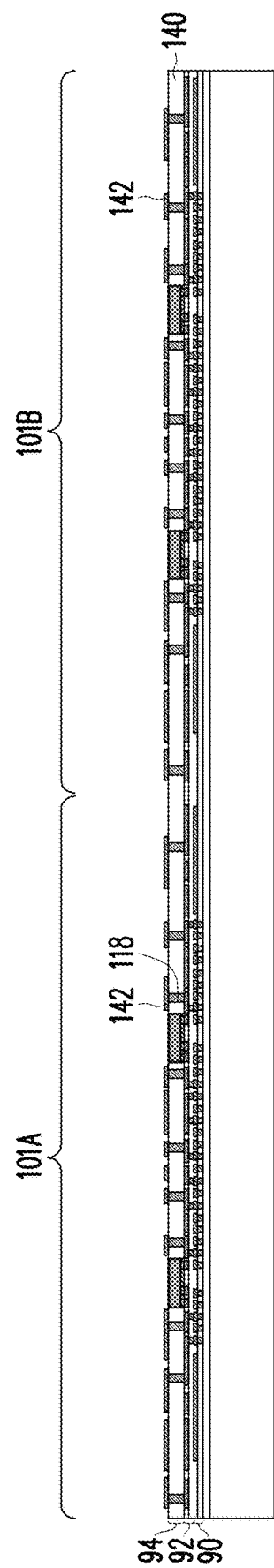

In FIG. 10, conductive lines 142 are formed on the dielectric layer 140 and the conductive vias 118 and connected to the conductive vias 118. The conductive lines 142 may be similar to the conductive lines 110 described above and the description is not repeated herein.

Figure 11:
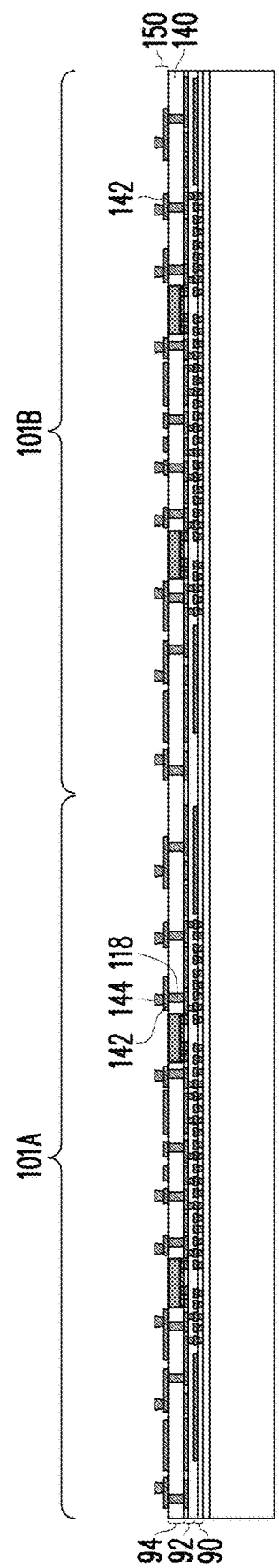

In FIG. 11, conductive vias 144 are formed on and extending from the conductive lines 142. The conductive vias 144 may be similar to the conductive vias 106 described above and the description is not repeated herein. Conductive lines 142 and conductive vias 144, together, form the metallization pattern for redistribution layer 150.

Figure 12:
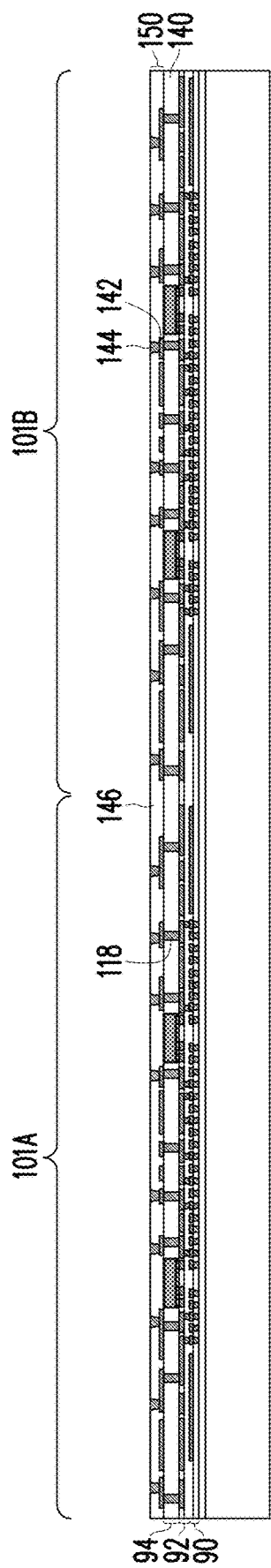

In FIG. 12, a dielectric layer 146 is formed on and around the conductive lines 142 and the conductive vias 144 in accordance with some embodiments. After formation, the dielectric layer 146 surrounds the conductive vias 144 and conductive lines 142. The dielectric layer 146 and metallization pattern, including conductive vias 144 and conductive lines 142, form a redistribution layer 150. The dielectric layer 146 may be similar to the dielectric layer 140 described above and the description is not repeated herein. In some embodiments, the dielectric layer 146 is formed over the dielectric layer 140 and the local interconnect components 120 such that the conductive lines 142 and conductive vias 144 are buried or covered, and a planarization process is then performed on the dielectric layer 146 to expose the conductive vias 144. Topmost surfaces of the dielectric layer 146 and conductive vias 144 are substantially level (e.g., planar) within process variations after the planarization process. The planarization process may be, for example, a CMP. In some embodiments, the dielectric layer 146 may comprise other materials, such as silicon oxide, silicon nitride, or the like.

Figure 13:
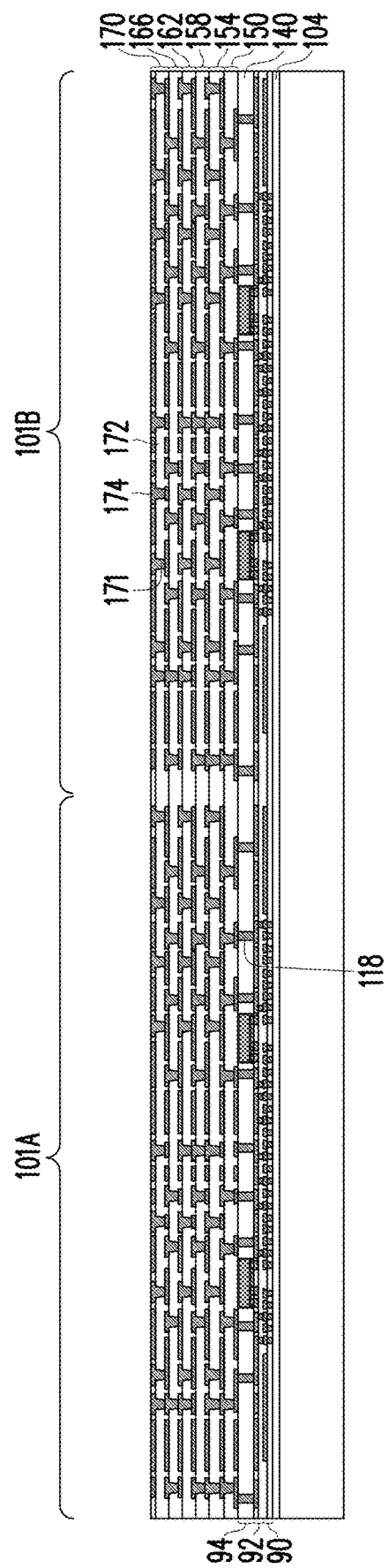

In FIG. 13, the steps and process discussed above to form redistribution layer 150 are repeated to form additionally shown redistribution layers 154, 158, 162, 166, and 170. In some embodiments, the process described above to form the redistribution layer 150 may be repeated one or more times to provide additional routing layers as desired for a particular de150, 154, 158, 162, 166, and 170 140sign. Nine redistribution layers 90, 92, 94, 150, 154, 158, 162, 166, and 170 are shown for illustrative purposes. In some embodiments more or less than nine may be used. The metallization patterns for each redistribution layer 90, 92, 94, 150, 154, 158, 162, 166, and 170 may have separately formed conductive lines and conductive vias (as shown), or may each be a single pattern having line and via portions.

In some embodiments, an additional set of conductive lines 174 are formed over each conductive via 171 and portion of the dielectric layer 172 of the uppermost redistribution layer, e.g., the redistribution layer 170 in the illustrated embodiment. This additional set of conductive lines 174 provides a larger dimensional footprint for connecting a core substrate as discussed below.

Where encapsulant and a subsequent CMP process is used to planarize redistribution layers 150, 154, 158, 162, 166, and 170, the dimensions, and roughness of the associated layers can be well controlled and more easily built up to larger thicknesses. In some embodiments, the thickness of redistribution layers 150, 154, 158, 162, 166, and 170 is each between 5 μm and 100 μm. More or fewer redistribution layers may be formed by, respectively, repeating or omitting the steps and process discussed above.

Although FIGS. 4 through 13 illustrate a formation process that forms conductive lines and vias before the dielectric layer that surrounds the conductive lines and vias, other formation processes are within the scope of this disclosure. For example, in other embodiments, a dielectric layer is first formed and then the metallization pattern (which includes both lines and vias) are formed. The metallization pattern includes conductive elements extending along the major surface of the dielectric layer and extending through the dielectric layer to physically and electrically couple to an underlying conductive layer. As an example to form the metallization pattern, openings are formed through the dielectric layer in the locations where vias are desired and a seed layer is formed over the dielectric layer and in the openings extending through the dielectric layer. A photoresist is then formed and patterned on the seed layer. The patterning forms openings through the photoresist to expose the seed layer, with the pattern of the openings corresponding to the metallization pattern. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern. The photoresist and portions of the seed layer on which the conductive material is not formed are removed. Once the photoresist is removed, exposed portions of the seed layer are removed, such as by using an acceptable etching process, such as by wet or dry etching. The combination of the dielectric layer and the metallization pattern form the redistribution layer.

Figure 14:
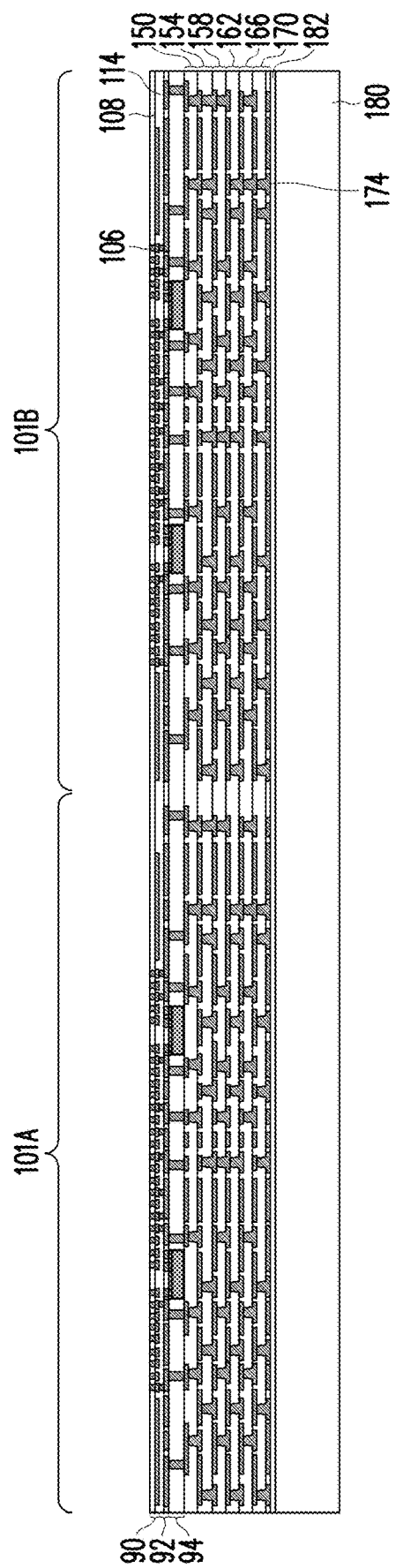

In FIG. 14, a carrier substrate de-bonding is performed to detach (or "de-bond") the carrier substrate 102 from the dielectric layer 108 and conductive vias 106. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on another carrier substrate 180 and release layer 182.

A planarization process may be performed, if necessary, on the dielectric layer 108 and conductive vias 106 (and any remaining release layer 104) to expose the conductive vias 106. Topmost surfaces of the dielectric layer 108 and conductive vias 106 are substantially level (e.g., planar) after the planarization process within process variations. The planarization process may be, for example, a chemical-mechanical polish (CMP), a grinding process, or the like. In some embodiments, the planarization may be omitted, for example, if the conductive vias 106 are already exposed. Other processes may be used to achieve a similar result. For example, a dielectric or passivation layer may be formed over conductive vias 106 after the debonding process. In such cases, the dielectric or passivation layer may be patterned in a subsequent step to expose portions of the conductive vias 106.

Figure 15:
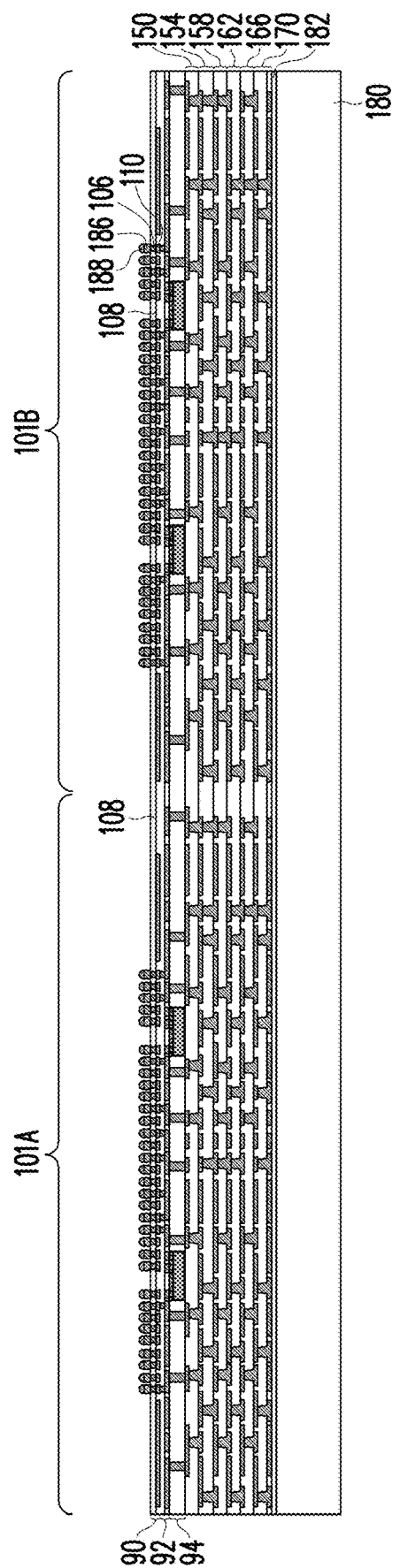

In FIG. 15, under-bump metallizations (UBMs) 186 (sometimes referred to as pads 186) are formed for external connection to conductive vias 106. The UBMs 186 have bump portions on and extending along the major surface of the dielectric layer 108, and may have via portions extending into the dielectric layer 108 to physically and electrically couple the conductive via 106. As a result, the UBMs 186 are electrically coupled to the through conductive lines 110 and the local interconnect components 120. The UBMs 186 may be formed of the same material as the conductive vias 106.

In FIG. 15, conductive connectors 188 are formed on the UBMs 186. The conductive connectors 188 allow for physical and electrical connection to dies or another package structure. The conductive connectors 188 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 188 may include a conductive material such as solder, copper, aluminum, gold, nickel, silver, palladium, tin, the like, or a combination thereof. In some embodiments, the conductive connectors 188 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 188 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 16:
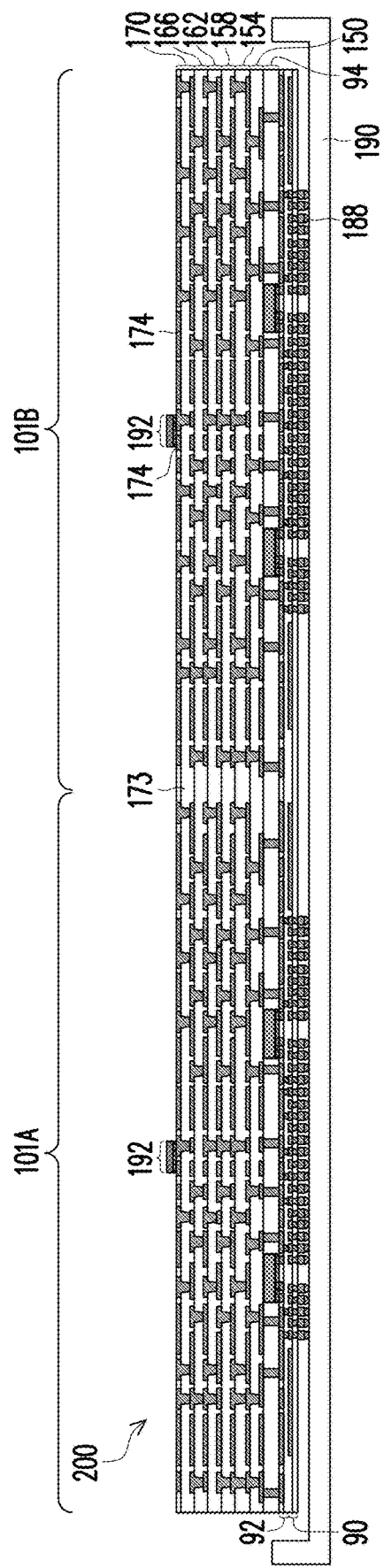

In FIG. 16, a carrier substrate de-bonding is performed to detach (or "de-bond") the carrier substrate 180 from the conductive lines 174 and/or the dielectric layer 172. In accordance with some embodiments, the de-bonding includes projecting a light such as a laser light or an UV light on the release layer 182 so that the release layer 182 decomposes under the heat of the light and the carrier substrate 180 can be removed. The structure is then flipped over and placed on a frame 190.

Further in FIG. 16, integrated passive devices (IPDs) 192 may be bonded to the conductive lines 174. The IPDs 192 may be formed in a similar manner to the local interconnect components 120 and may include one or more passive devices such as capacitors, resistors, inductors, the like, or a combination thereof. In some embodiments, the IPDs 192 are hybrid bonded to the conductive lines 174 in a similar manner described above for the local interconnect components 120 and the description is not repeated herein.

Figure 17:
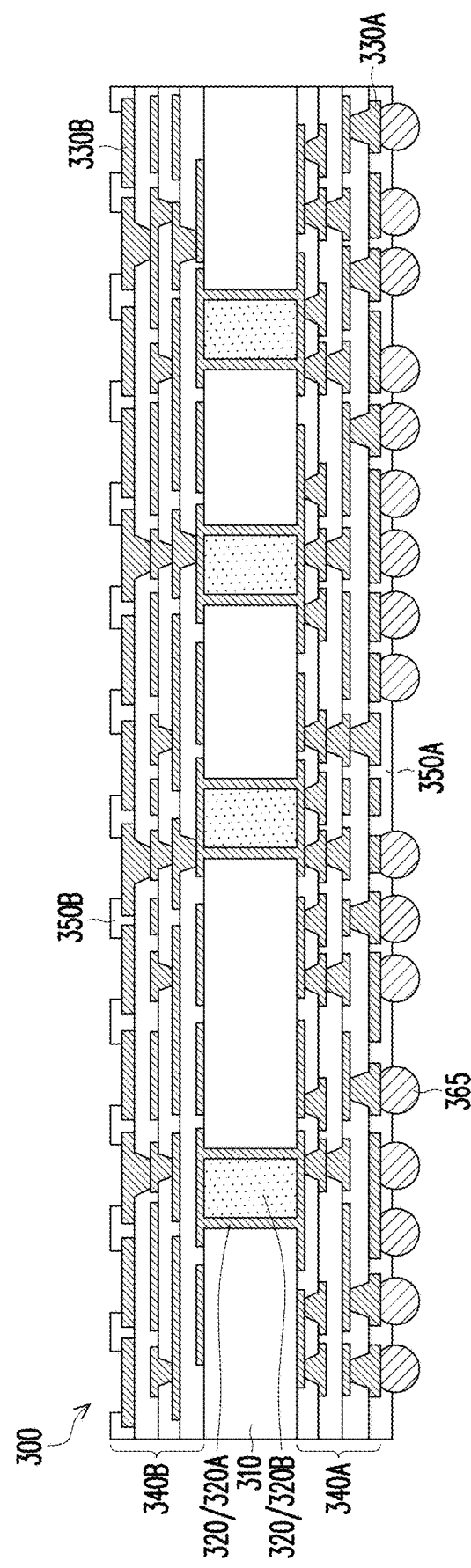
Figure 18:
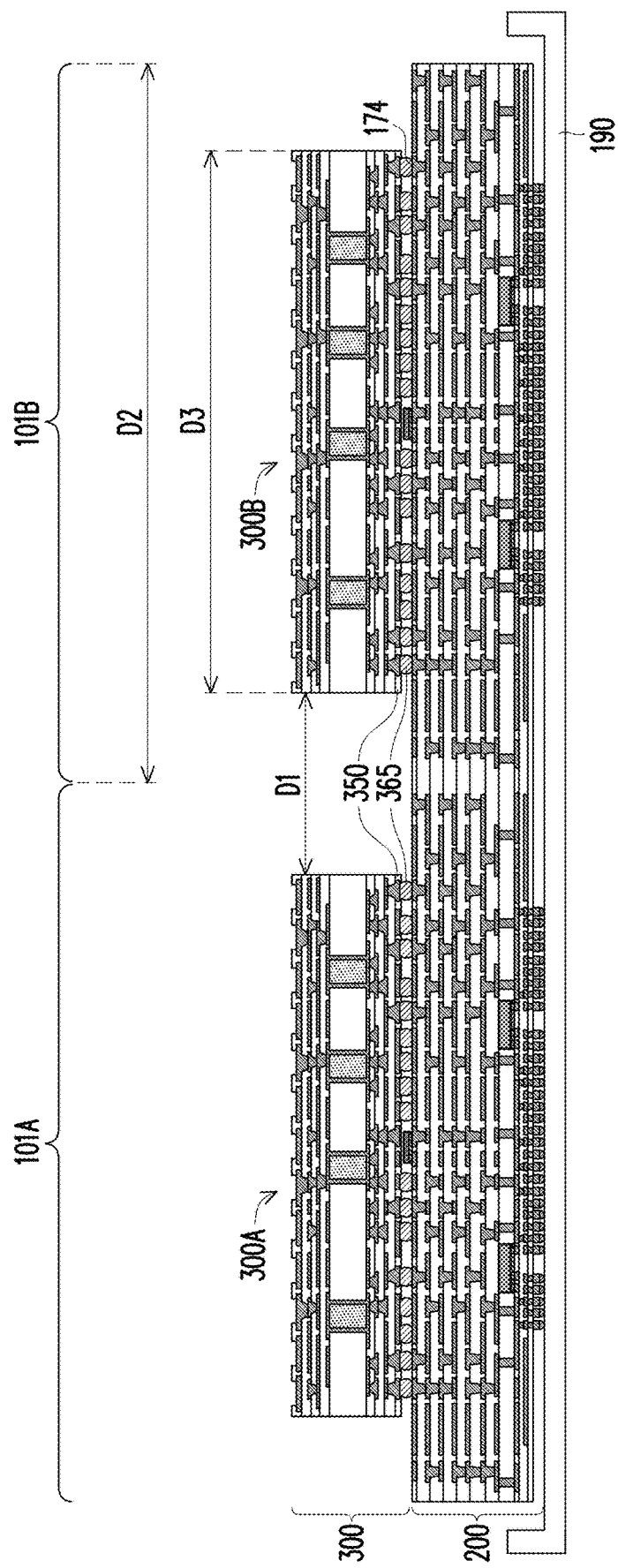

In FIG. 17, a core substrate 300 is illustrated and, in FIG. 18, is bonded the redistribution structure 200. Utilizing the core substrate 300 has the advantage of having the core substrate 300 being manufactured in a separate process. In addition, because core substrate 300 is formed in a separate process, it can be tested separately so that a known good core substrate 300 is used. For example, in some embodiments, the core substrate 300 may be individually or batch tested, validated, and/or verified prior to bonding the core substrate 300 to the redistribution structure 200.

The core substrate 300 may be, e.g., an organic substrate, a ceramic substrate, a silicon substrate, or the like. Conductive connectors 365 are used to attach the core substrate 300 to the redistribution structure 200. Attaching the core substrate 300 may include placing the core substrate 300 on the redistribution structure 200 and reflowing the conductive connectors 365 to physically and electrically couple the core substrate 300 and the redistribution structure 200.

Before being attached to the redistribution structure 200, the core substrate 300 may be processed according to applicable manufacturing processes to form redistribution structures in the core substrate 300. For example, the core substrate 300 includes a core 310. The core 310 may be formed of one or more layers of glass fiber, resin, filler, pre-preg, epoxy, silica filler, Ajinomoto Build-up Film (ABF), polyimide, molding compound, other materials, and/or combinations thereof. In some embodiments, for example, two layers are of material make up the core 310. The core 310 may be formed of organic and/or inorganic materials. In some embodiments, the core 310 includes one or more passive components (not shown) embedded inside. The core 310 may comprise other materials or components.

Conductive vias 320 are formed extending through the core 310. The conductive vias 320 comprise a conductive material 320A such as copper, a copper alloy, or other conductors, and may include a barrier layer (not shown), liner (not shown), seed layer (not shown), and/or a fill material 320B, in some embodiments. The conductive vias 320 provide vertical electrical connections from one side of the core 310 to the other side of the core 310. For example, some of the conductive vias 320 are coupled between conductive features at one side of the core 310 and conductive features at an opposite side of the core 310. Holes for the conductive vias 320 may be formed using a drilling process, photolithography, a laser process, or other methods, as examples, and the holes of the conductive vias 320 are then filled or plated with conductive material. In some embodiments, the conductive vias 320 are hollow conductive through vias having centers that are filled with an insulating material. Redistribution structures 340A and 340B are formed on opposing sides of the core 310. The redistribution structures 340A and 340B are electrically coupled by the conductive vias 320, and fan-in/fan-out electrical signals.

The redistribution structures 340A and 340B each include dielectric layers, formed of ABF, pre-preg, or the like, and metallization patterns. Each respective metallization pattern has line portions on and extending along a major surface of a respective dielectric layer, and has via portions extending through the respective dielectric layer. The redistribution structures 340A and 340B each, respectively, include under-bump metallurgies (UBMs) 330A and 330B for external connection, and solder resists 350A and 350B protecting the features of the redistribution structures 340A and 340B. The redistribution structure 340A is attached to the redistribution structure 200 by the UBMs 330A through the conductive connectors 365 as illustrated in FIG. 11. More or fewer dielectric layers and metallization patterns may be formed in the redistribution structures 340A and 340B than shown in FIG. 11.

The core substrate 300 may include active and passive devices (not shown), or may be free from either active devices, passive devices, or both. A wide variety of devices such as transistors, capacitors, resistors, inductors, combinations of these, and the like may be used. The devices may be formed using any suitable methods.

Conductive connectors 365 may be used to bond the core substrates 300A and 300B to the redistribution structure 200 as illustrated in FIG. 18. The conductive connectors 365 may be first formed on either the core substrates 300A and 300B, or the redistribution structure 200, and then reflowed to complete the bond. For example, in the embodiment shown in FIG. 18, conductive connectors 365 are formed on UBMs 330A of the bottom redistribution structure 340A with a pitch between 150 µm and 1000 µm. The conductive connectors 365 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 365 may include a conductive material such as solder, copper, aluminum, gold, nickel, silver, palladium, tin, the like, or a combination thereof. In some embodiments, the conductive connectors 365 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 365 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In FIG. 18, core substrates 300A and 300B are bonded to the redistribution structure 200 (see, e.g., FIG. 16) in first package region 101A and second package region 101B, respectively. In some embodiments, the core substrate 300A is separated from the adjacent core substrate 300B by a distance D1 between about 25 μm and about 1,000 μm. This distance provides space between a first package region 101A and a second package region 101B for singulation of the redistribution structure 200 into separate packages in a subsequent process. In embodiments such as that illustrated in FIG. 18, dimensions D3 of the core substrates 300A and 300B is less than the dimensions of the first package region 101A and second package region 101B D2, respectively to allow for encapsulation and singulation without damaging the core substrates 300A and 300B. In some embodiments, a standoff height of 20 μm to 500 μm is utilized between the core substrates 300A and 300B and the redistribution structure 200.

In some embodiments, the core substrates 300A and 300B may be placed on the redistribution structure 200 using a pick and place process or another suitable process and the conductive connectors 365 bonded by flip chip bonding process or other suitable bonding process. In some embodiments, the conductive connectors 365 are reflowed to attach the core substrates 300A and 300B to the redistribution structure 200 by way of metallization pattern 174. The conductive connectors 365 electrically and/or physically couple the core substrates 300A and 300B to the redistribution structure 200.

The conductive connectors 365 may have an epoxy flux (not shown) formed thereon before they are reflowed with at least some of the epoxy portion of the epoxy flux remaining after the core substrates 300A and 300B are attached to the redistribution structure 200.

Figure 19:
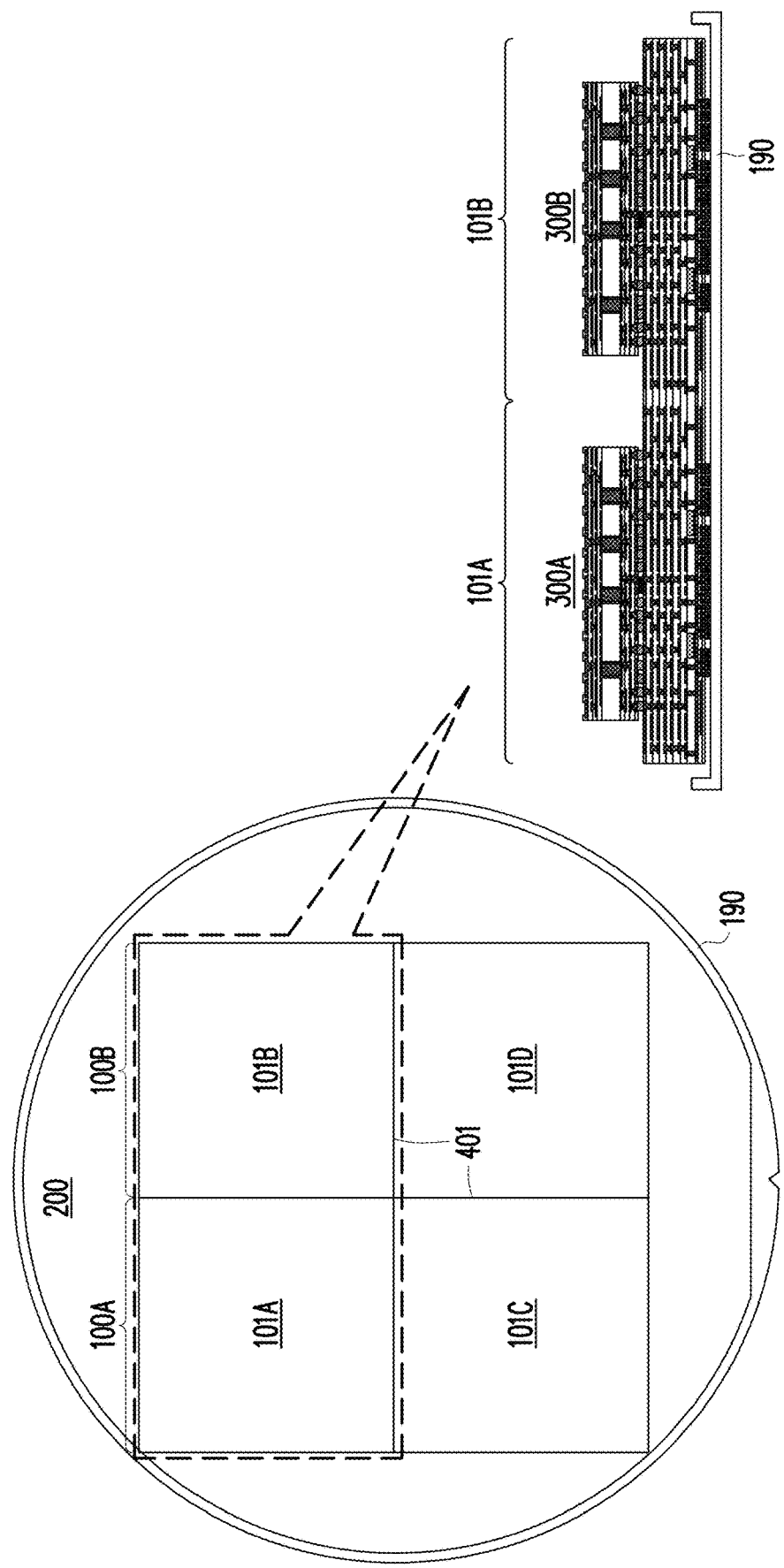
FIG. 19 illustrates a planar view of the layout of package regions on a wafer substrate in accordance with some embodiments.

As discussed above, the redistribution structure 200 may be larger and include multiple package regions, such as the first package region 101A and second package region 101B. For example, FIG. 19 illustrates the redistribution structure 200 having a circular wafer shape with multiple package regions. In the embodiment shown, four package regions 101A, 101B, 101C, and 101D are included on the wafer allowing for four final package components to be fabricated on a single wafer and later singulated. Fewer or more package regions may be utilized on a single wafer in other embodiments. Subsequent steps in the process use the redistribution structure 200 on a wafer form frame 190 as the base upon which to continue the fabrication process described in further detail below. As described in further detail below, the individual package regions are singulated by sawing along lines 401 and around the outer edges of package regions 101A, 101B, 101C, and 101D.

Figure 20:
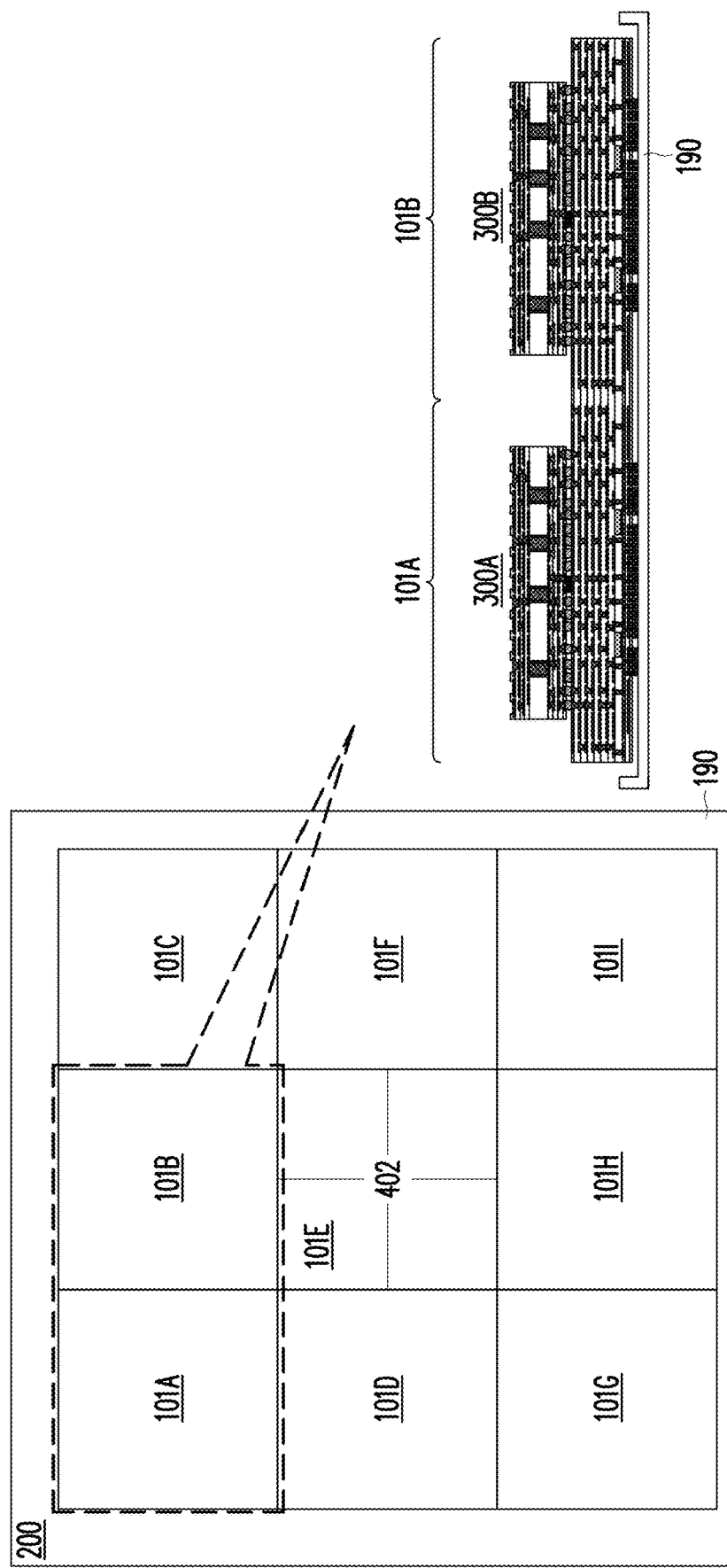
FIG. 20 illustrates a planar view of the layout of package regions on a panel substrate in accordance with some embodiments.

FIG. 20 illustrates the redistribution structure 200 being manufactured using a panel form fabrication process with multiple package regions. In the embodiment shown, nine package regions 101A through 101I are included on the wafer allowing for nine final package components to be fabricated on a single wafer or panel. Fewer or more package regions may be utilized on a single wafer or panel in other embodiments. Subsequent steps in the process use the redistribution structure 200 on a panel form frame 190 as the base upon which to continue the fabrication process described in further detail below. As described in further detail below, the individual package regions are singulated by sawing along lines 402 and around the perimeter of package regions 101A through 101I.

Figure 21:
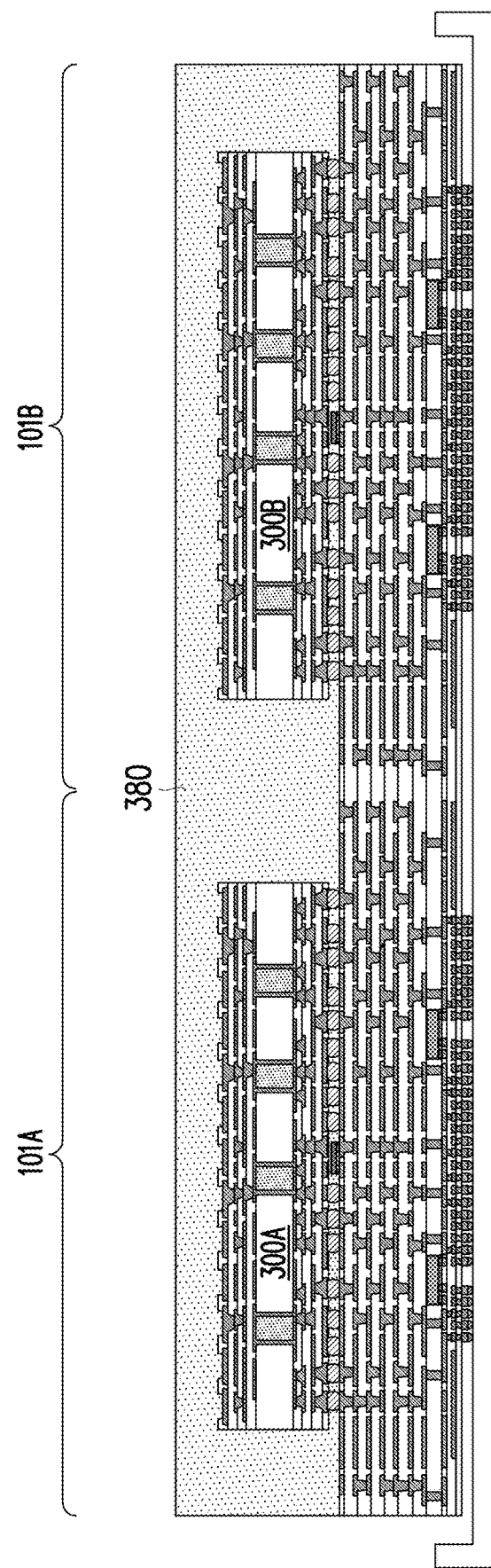

In FIG. 21, an encapsulation is performed by forming encapsulant 380 on and around the various components. After formation, the encapsulant 380 surrounds the core substrates 300A and 300B, including conductive connectors 365, metallization pattern 174, and the upper exposed surface of dielectric layer 172. The encapsulant 380 may be formed of a molding compound, epoxy, or the like, and may be applied by compression molding, transfer molding, or the like. The encapsulant 380 may be applied in liquid or semi-liquid form and then subsequently cured. The encapsulant 380 may be formed over the frame 190 such that core substrates 300A and 300B are buried or covered.

Figure 22:
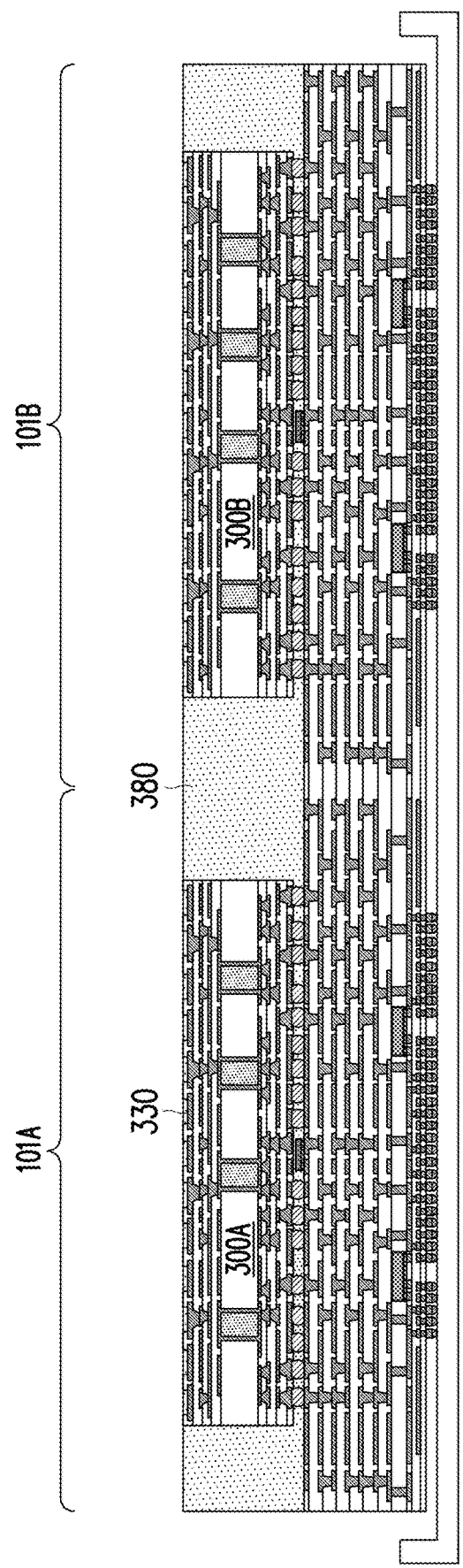

In FIG. 22, a planarization process may be performed, if necessary, on the encapsulant 380 to expose the UBMs 330 of the core substrates 300A and 300B. Topmost surfaces of the encapsulant 380 and UBMs 330 are substantially level (e.g., planar) after the planarization process within process variations. The planarization process may be, for example, a chemical-mechanical polish (CMP), a grinding process, or the like. In some embodiments, the planarization may be omitted, for example, if the UBMs 330 are already exposed. Other processes may be used to achieve a similar result. For example, a dielectric or passivation layer may be formed over UBMs 330 prior to forming the encapsulant 380. In such cases, the dielectric or passivation layer may be patterned in a subsequent step to expose portions of the UBMs 330.

Figure 23:
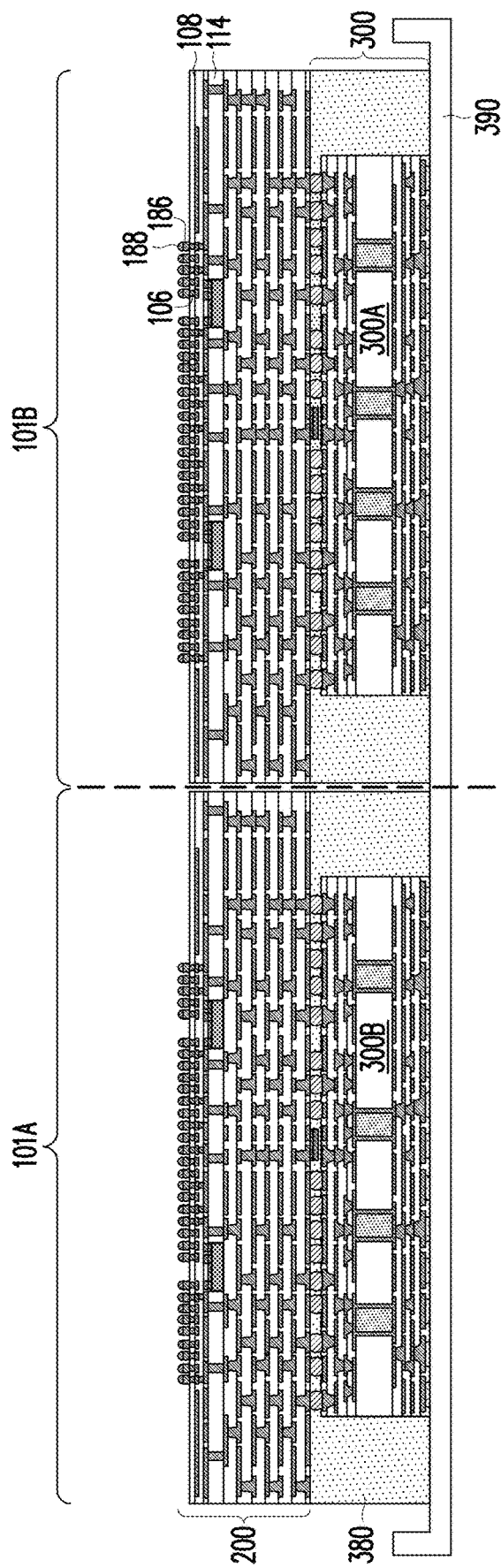

In FIG. 23, the structure is removed from the frame 190 and flipped over onto a frame 390. In some embodiments, the frames 190 and 390 are the same frame.

Further in FIG. 23, a singulation process is performed by sawing along scribe line regions, e.g., between the first package region 101A and the second package region 101B. The sawing singulates the first package region 101A from adjacent package regions, including second package region 101B (shown) to form multiple singulated package components 100. As illustrated in FIG. 23, sidewalls of the core substrate 300 are covered with the encapsulant 380, thereby protecting the sidewalls of the core substrates 300A and 300B during and after singulation.

The integrated circuit package 500, as shown in FIG. 1, may be attached to the singulated package component 100 through the conductive connectors 188. The conductive connectors 188 attach the integrated circuit package 500 to the UBMs 186 and redistribution structure 200 of the singulated package component 100. Attaching the integrated circuit package 500 may include placing the dies 512, 514, and 516 of the integrated circuit package 500 on the conductive connectors 188 and reflowing the conductive connectors 188 to physically and electrically couple the integrated circuit package 500 and the singulated package component 100.

In some embodiments, an underfill 610, as shown in FIG. 1, is formed surrounding the conductive connectors 188 between the integrated circuit package 500 and the redistribution structure 200. The underfill 610 may reduce stress and protect the joints resulting from the reflowing of the conductive connectors 188. The underfill 610 may be formed by a capillary flow process after the integrated circuit package 500 is attached, or may be formed by a suitable deposition method. In some embodiments, a single layer of underfill 610 is formed beneath multiple adjacent devices, and further subsequent underfills (not shown) or encapsulants (not shown) may be formed beneath and/or around additional devices placed on top of the singulated package component 100.

External connectors 620, as shown in FIG. 1, are formed on the UBMs 330B of the core substrate 300. The external connectors 620 may be ball grid array (BGA) connectors, solder balls, metal pillars, controlled collapse chip connection (C4) bumps, micro bumps, or the like. The external connectors 620 may include a conductive material such as solder, copper, aluminum, gold, nickel, silver, palladium, tin, the like, or a combination thereof. In some embodiments, the external connectors 620 are formed by initially forming a layer of reflowable material on the UBMs 330 through evaporation, electroplating, printing, solder transfer, ball placement, or the like. Once a layer of reflowable material has been formed on the UBMs 330B a reflow may be performed in order to shape the material into the desired bump shapes.

FIGS. 24 through 29 illustrates various intermediate stages in fabricating a redistribution structure 700 (see FIG. 29) in accordance with some embodiments. The redistribution structure 700 is similar to the redistribution structure 200 except that in this embodiment the layers of the redistribution structure are formed in a different order. For example, in this embodiment, the process starts with the layer including conductive lines 116, conductive vias 118, local interconnect components 120, and dielectric layer 140 instead of the redistribution layers 90 and 92. Details regarding this embodiment that are similar to those for the previously described embodiment will not be repeated herein.

A first package region 101A and a second package region 101B are illustrated where each package region is eventually singulated from other package regions. The illustrations of the individual features have been simplified in FIGS. 24 through 29 for ease of illustration.

Figure 24:
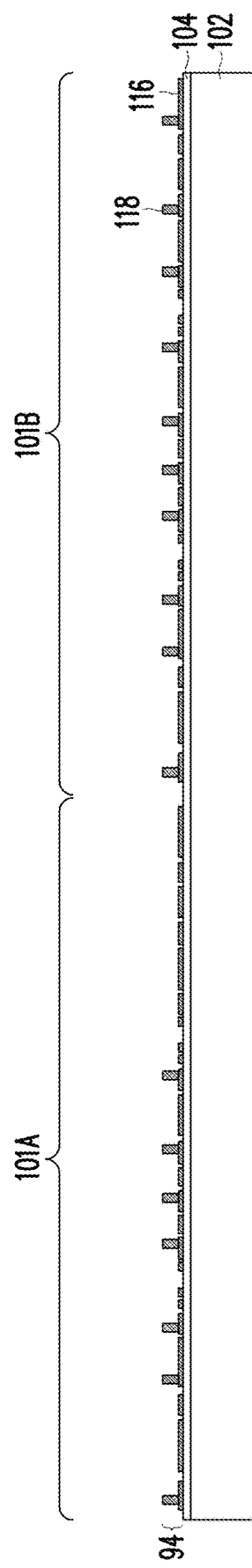
FIGS. 24 through 29 illustrate cross-sectional views of intermediate steps during a process for forming a package component in accordance with some embodiments.
Figure 25:
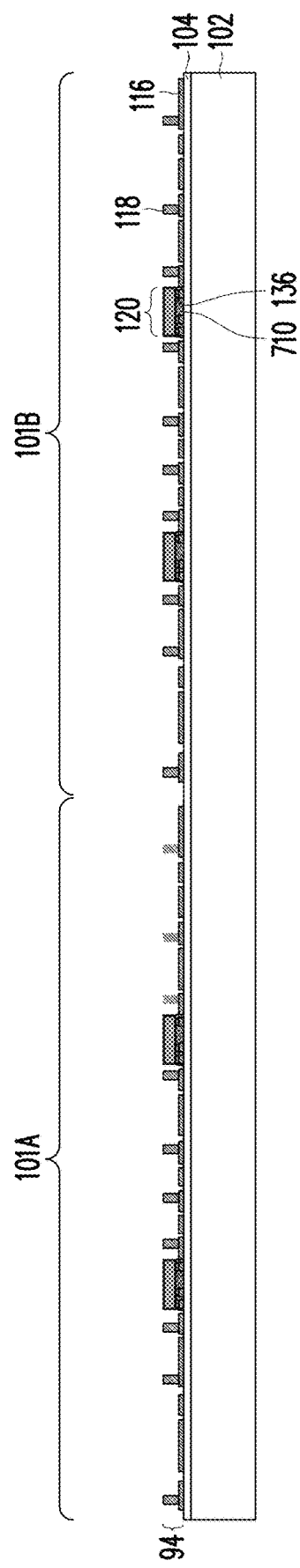
Figure 26:
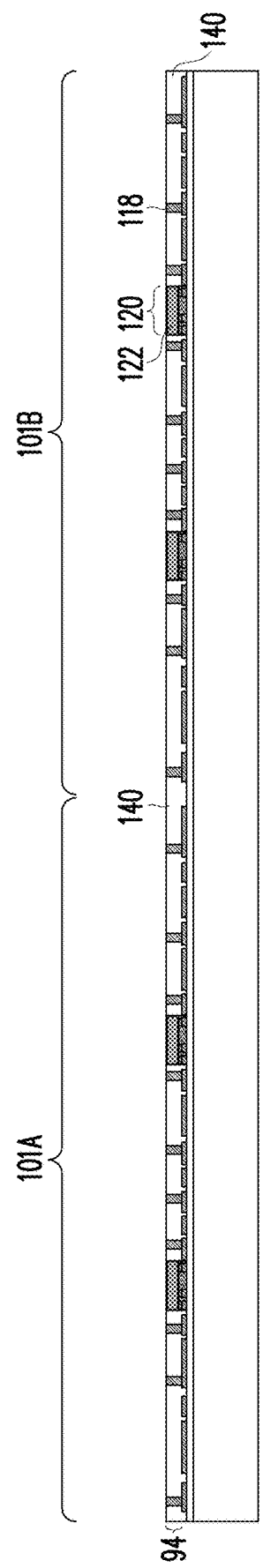

In FIGS. 24 through 26, the redistribution layer 94 is formed over the release layer 104 over the carrier substrate 102. In FIG. 24, the conductive lines 116 are formed over the release layer and the conductive vias 118 are formed on the conductive lines 116. These structures were described above in the previous embodiment and the descriptions are not repeated herein.

In FIG. 25, the local interconnect components 120 are bonded to the conductive lines 116 by way of die connectors 136. The local interconnect components 120 are similar to the local interconnect components 120 described above in the previous embodiment and the descriptions are not repeated herein.

In some embodiments, the local interconnect components 120 are bonded by hybrid bonding as described in the previous embodiment. In some embodiments, the local interconnect components are bonded only by metal-to-metal bonding by way of the conductive lines 116 and the die connectors 136. In the metal-to-metal only embodiments, an underfill 710 may be formed between the local interconnect components 120 and the release layer 104 and surrounding the die connectors 136 and conductive lines 116. The underfill 710 may be similar to the underfill 610 described above and the description is not repeated herein.

In FIG. 26, the dielectric layer 140 is formed on and around the conductive vias 118 and the local interconnect components 120 in accordance with some embodiments. The dielectric layer 140 encapsulates the local interconnect components 120 and the conductive vias 118. The dielectric layer 140 was previously described and the description is not repeated herein.

In some embodiments, a planarization process is then performed on the dielectric layer 140 to expose the conductive vias 118 and the backsides of the substrates 122 of the local interconnect components 120. Topmost surfaces of the dielectric layer 140, conductive vias 118, and the substrates 122 of the local interconnect components 120 are substantially level (e.g., planar) within process variations after the planarization process.

Figure 27:
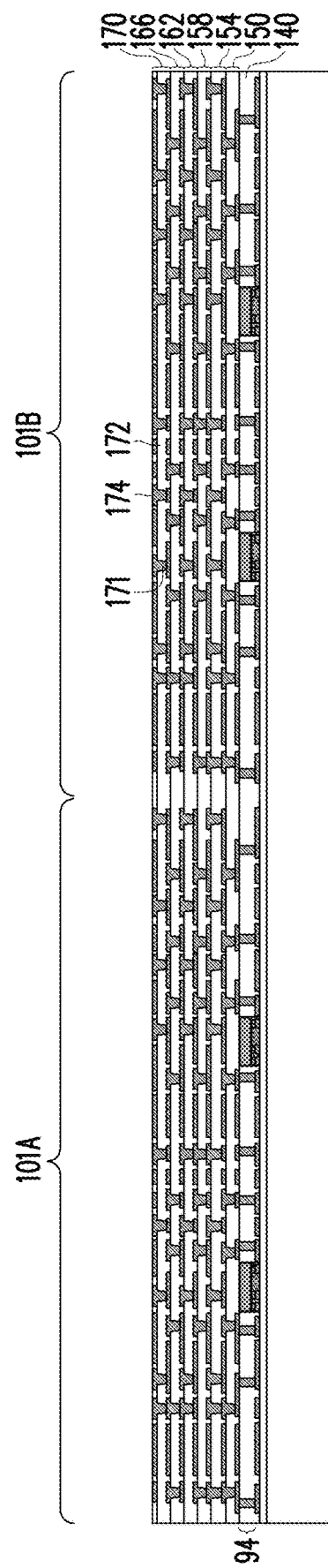

In FIG. 27, the redistribution layers 150, 154, 158, 162, 166, and 170 are formed over the dielectric layer 140, the local interconnect components 120, and the conductive vias 118. These structures were described above in the previous embodiment and the descriptions are not repeated herein.

In some embodiments, an additional set of conductive lines 174 are formed over each conductive via 171 and portion of the dielectric layer 172 of the uppermost redistribution layer, e.g., the redistribution layer 170 in the illustrated embodiment. This additional set of conductive lines 174 provides a larger dimensional footprint for connecting a core substrate as discussed below.

Figure 28:
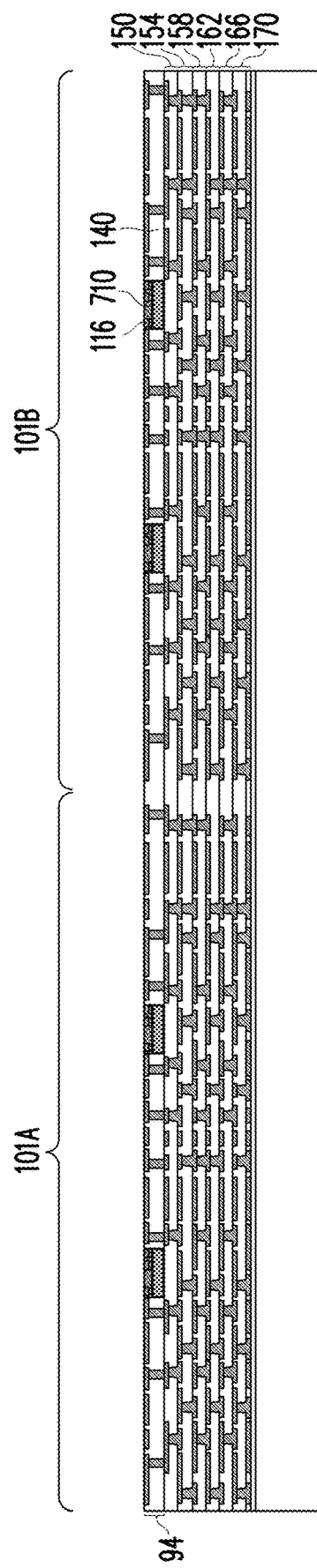

In FIG. 28, a carrier substrate de-bonding is performed to detach (or "de-bond") the carrier substrate 102 from the dielectric layer 140 and conductive lines 116. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on another carrier substrate 180 and release layer 182.

Figure 29:
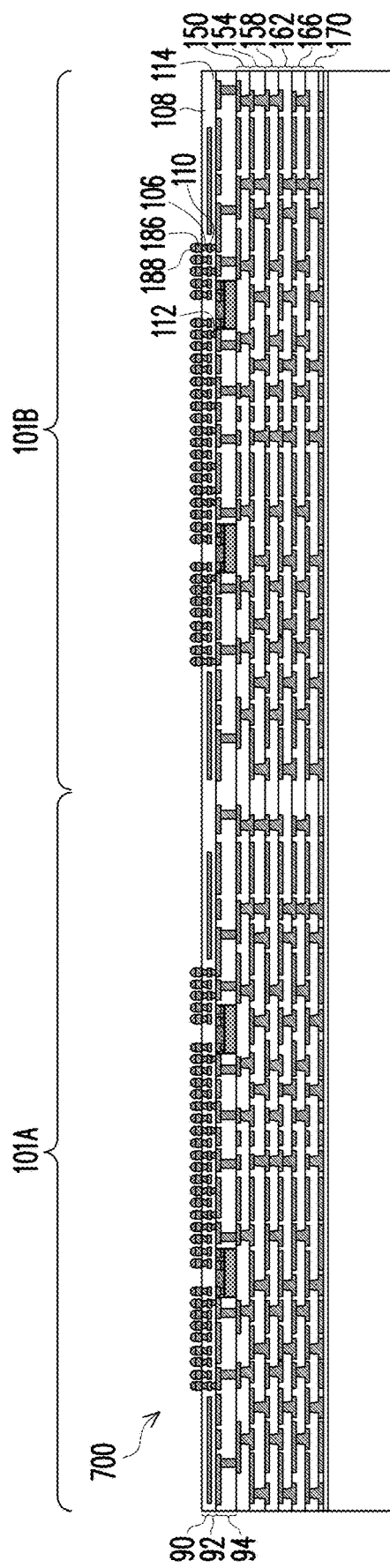

In FIG. 29, the redistribution layers 90 and 92 are formed to form the redistribution structure 700. Specifically, the conductive vias 112, dielectric layer 114, conductive lines 110, conductive vias 106, UBMs 186, and conductive connectors 188 are formed over the exposed dielectric layer 140, the conductive lines 116, and the underfill 710. These structures were described above in the previous embodiment and the descriptions are not repeated herein.

This redistribution structure 700 will undergo subsequent processing as described in the previous embodiment to achieve the structure shown in FIG. 1 such that the redistribution structure 200 in FIG. 1 is replace with the redistribution structure 700.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. For example, the local interconnect components increase the communication bandwidth between the integrated circuit dies while maintaining low contact resistance and high reliability. The low contact resistance and high reliability is at least in part due to a solder-free connection between the embedded local interconnect component and the redistribution structure. Further, the redistribution structure, the embedded local interconnect component, the core substrate, and the integrated circuit dies, may be individually fabricated and tested prior to assembling the completed package component. This further increases component and board level reliability. Because of the increased communication bandwidth between the integrated circuit dies provided by the local interconnect components, an interposer is not required between the integrated circuit dies and the redistribution structure. By removing the need for an interposer, the warpage mismatch between the integrated circuit package (including the integrated circuit dies) and the core substrate package (including the core substrate and the redistribution structure) is reduced because the coefficient of thermal expansion (CTE) mismatch between these two package structures is reduced.

In an embodiment, a structure includes a core substrate, a redistribution structure coupled to a first side of the core substrate, the redistribution structure including
a plurality of redistribution layers, each of the plurality of redistribution layers comprising a dielectric layer and a metallization layer, a first local interconnect component embedded in a first redistribution layer of the plurality of redistribution layers, the first local interconnect component comprising a substrate, an interconnect structure on the substrate, and conductive connectors, the conductive connectors being bonded to a metallization layer of the first redistribution layer, the metallization layer of the first redistribution layer comprising first conductive lines and first conductive vias, the dielectric layer of the first redistribution layer encapsulating the first local interconnect component, a first integrated circuit die coupled to the redistribution structure, the redistribution structure being interposed between the core substrate and the first integrated circuit die, a second integrated circuit die coupled to the redistribution structure, the redistribution structure being interposed between the core substrate and the first integrated circuit die, the interconnect structure of the first local interconnect component electrically coupling the first integrated circuit die to the second integrated circuit die, and a set of conductive connectors coupled to a second side of the core substrate.

Embodiments may include one or more of the following features. The structure where the redistribution structure is coupled to the first side of the core substrate using first solder connections. The structure further including an encapsulant interposed between the redistribution structure and the core substrate. The encapsulant extends along sidewalls of the core substrate. The structure further including an integrated passive device bonded to the redistribution structure, the integrated passive device being interposed between the redistribution structure and the core substrate. The first local interconnect component is hybrid bonded to the metallization pattern and a dielectric layer of the first redistribution layer. The interconnect structure of the first local interconnect component is on a first side of the substrate of the first local interconnect component, the first side of the first local interconnect component facing the first integrated circuit die. The substrate of the first local interconnect component is a silicon substrate.

In an embodiment, a method includes forming a first redistribution structure over a first carrier substrate, where forming the first redistribution structure includes forming a first set of conductive lines over the first carrier substrate. The method also includes forming a first set of conductive vias over and electrically coupled to the first set of conductive lines. The method also includes bonding a first interconnecting die to the first set of conductive lines, the first interconnecting die including a substrate, an interconnect structure on the substrate, and die connectors on the interconnect structure, the die connectors being bonded to the first set of conductive lines, the first interconnecting die being between two of the first set of conductive vias. The method also includes forming a first dielectric layer over the first set of conductive lines, the first set of conductive vias, and the first interconnecting die, the first dielectric layer, the first set of conductive vias, the first set of conductive lines, and the first interconnecting die forming a first redistribution layer. The method also includes forming a second redistribution layer over the first redistribution layer, the second redistribution layer including a second dielectric layer, a second set of conductive vias, and a second set of conductive lines, at least one of the second set of conductive lines being electrically coupled to at least one of the first set of conductive vias. The method also includes removing the first carrier substrate. The method also includes electrically connecting a core substrate to a first side of the first redistribution structure, the second redistribution layer being nearer the first side of the first redistribution layer than the first redistribution layer. The method also includes bonding a first integrated circuit die and a second integrated circuit die to a second side of the first redistribution structure, the second side being opposite the first side, the first integrated circuit die and the second integrated circuit die being electrically coupled to the first interconnecting die.

Embodiments may include one or more of the following features. The method further including, after electrically connecting the core substrate to the first side of the first redistribution structure, forming a first encapsulant around the core substrate. The method further including after forming the first encapsulant around the core substrate, singulating through the first redistribution structure and the first encapsulant. Bonding the first interconnecting die to the first set of conductive lines including a hybrid bonding process. The method further including forming a third redistribution layer over the first carrier substrate, the first redistribution layer being formed over the third redistribution layer, the third redistribution layer including a third dielectric layer and a third set of conductive vias at least one of the third set of conductive vias being electrically coupled to at least one of the first set of conductive lines, the third redistribution layer being between the first integrated circuit die and the first redistribution layer. The third dielectric layer is made of a different material than the first dielectric layer. The method further including after removing the first carrier substrate and before electrically connecting the core substrate, forming a third redistribution layer on the first redistribution layer, the first redistribution layer being between the third redistribution layer and the second redistribution layer, the third redistribution layer including a third dielectric layer and a third set of conductive vias at least one of the third set of conductive lines being electrically coupled to at least one of the first set of conductive lines, the third redistribution layer being between the first integrated circuit die and the first redistribution layer.

In an embodiment, a package includes a first redistribution structure, the first redistribution structure including a plurality of redistribution layers, each of the plurality of redistribution layers including a metallization pattern and a dielectric layer, a first redistribution layer of the plurality of redistribution layers including a first dielectric layer and a first interconnecting die, the first interconnecting die including a substrate, an interconnect structure on the substrate, and die connectors on the interconnect structure, the die connectors being bonded to a metallization pattern of the first redistribution layer, the metallization pattern of the first redistribution layer including first conductive lines and first conductive vias, the first dielectric layer encapsulating the first interconnecting die. The package also includes a core substrate coupled to a first side of the first redistribution structure using a first set of conductive connectors, a width of the first redistribution structure being greater than a width of the core substrate. The package also includes an integrated circuit die package coupled to a second side of the first redistribution structure using a second set of conductive connectors, the second side being opposite the first side.

Embodiments may include one or more of the following features. The package where the first set of conductive connectors and the second set of conductive connectors each include solder, and where the die connectors of the first interconnecting die are bonded to the metallization pattern of the first redistribution layer without solder. The package further including an encapsulant interposed between the core substrate and the first redistribution structure. The first redistribution structure further includes a second redistribution layer, the second redistribution layer being between the first redistribution layer and the integrated circuit die package, the second redistribution layer including a second dielectric layer, the second dielectric layer being a different material than the first dielectric layer. The first redistribution structure further includes a first component within one of the plurality of redistribution layers, the first component being an integrated voltage regulator, an integrated passive device, or a static random-access-memory.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
    a core substrate;
    a redistribution structure coupled to a first side of the core substrate using first solder connectors, the redistribution structure comprising:
    a plurality of redistribution layers, each of the plurality of redistribution layers comprising a dielectric layer and a metallization layer; and
    a first local interconnect component embedded in a first redistribution layer of the plurality of redistribution layers, the first local interconnect component comprising a substrate, an interconnect structure on the substrate, and conductive connectors, the conductive connectors being bonded to a metallization layer of the first redistribution layer, the metallization layer of the first redistribution layer comprising first conductive lines and first conductive vias, the dielectric layer of the first redistribution layer encapsulating the first local interconnect component;
    a first integrated circuit die coupled to the redistribution structure, the redistribution structure being interposed between the core substrate and the first integrated circuit die;
    a second integrated circuit die coupled to the redistribution structure, the redistribution structure being interposed between the core substrate and the second integrated circuit die, the interconnect structure of the first local interconnect component electrically coupling the first integrated circuit die to the second integrated circuit die; and
    second solder connectors coupled to a second side of the core substrate.

2. The structure of claim 1 further comprising:
    an encapsulant interposed between the redistribution structure and the core substrate.

3. The structure of claim 2, wherein the encapsulant extends along sidewalls of the core substrate.

4. The structure of claim 1 further comprising:
    an integrated passive device bonded to the redistribution structure, the integrated passive device being interposed between the redistribution structure and the core substrate.

5. The structure of claim 1, wherein the first local interconnect component is direct bonded to the metallization layer and a dielectric layer of the first redistribution layer.

6. The structure of claim 1, wherein the interconnect structure of the first local interconnect component is on a first side of the substrate of the first local interconnect component, the first side of the first local interconnect component facing the first integrated circuit die.

7. The structure of claim 1, wherein the substrate of the first local interconnect component is a silicon substrate.

8. A structure comprising:
    a first redistribution structure, the first redistribution structure comprising:
    a plurality of redistribution layers, each of the plurality of redistribution layers comprising a metallization pattern and a dielectric layer, a first redistribution layer of the plurality of redistribution layers comprising a first dielectric layer and a first interconnecting die, the first interconnecting die comprising a substrate, an interconnect structure on the substrate, and die connectors on the interconnect structure, the die connectors being bonded to a metallization pattern of the first redistribution layer, the metallization pattern of the first redistribution layer comprising first conductive lines and first conductive vias, the first dielectric layer encapsulating the first interconnecting die; and
    a first component within one of the plurality of redistribution layers, the first component being an integrated voltage regulator, an integrated passive device, or a static random-access-memory;
    a core substrate coupled to a first side of the first redistribution structure using a first set of conductive connectors; and
    an integrated circuit die coupled to a second side of the first redistribution structure using a second set of conductive connectors.

9. The structure of claim 8, wherein the first set of conductive connectors and the second set of conductive connectors each comprise solder, and wherein the die connectors of the first interconnecting die are bonded to the metallization pattern of the first redistribution layer without solder.

10. The structure of claim 9, wherein the first component is bonded to a metallization pattern of one of the plurality of redistribution layers without solder.

11. The structure of claim 8, wherein the first interconnecting die is direct bonded to the metallization pattern and a dielectric layer of the first redistribution layer.

12. The structure of claim 8, further comprising:
    an encapsulant interposed between the core substrate and the first redistribution structure.

13. The structure of claim 12, wherein the encapsulant extends along sidewalls of the core substrate.

14. The structure of claim 8, wherein the interconnect structure of the first interconnecting die is on a first side of the substrate of the first interconnecting die, the first side of the first interconnecting die facing the integrated circuit die.

15. A method comprising:
   forming a first redistribution structure over a first carrier substrate, wherein forming the first redistribution structure comprises:
   forming a first set of conductive lines over the first carrier substrate; bonding a first interconnecting die to the first set of conductive lines, the first interconnecting die comprising a substrate, an interconnect structure on the substrate, and die connectors on the interconnect structure, the die connectors being bonded to the first set of conductive lines using a direct bonding process; and
   forming a first dielectric layer over the first set of conductive lines and the first interconnecting die, the first dielectric layer, the first set of conductive lines, and the first interconnecting die forming a first redistribution layer;
   removing the first carrier substrate;
   connecting a core substrate to a first side of the first redistribution structure using first solder connectors; and
   bonding a first integrated circuit die and a second integrated circuit die to a second side of the first redistribution structure using second solder connectors, the second side being opposite the first side, the first integrated circuit die and the second integrated circuit die being electrically coupled to the first interconnecting die.

16. The method of claim 15 further comprising:
   after connecting the core substrate to the first side of the first redistribution structure, forming a first encapsulant around the core substrate.

17. The method of claim 16 further comprising:
   after forming the first encapsulant around the core substrate, singulating through the first redistribution structure and the first encapsulant.

18. The method of claim 15 further comprising:
   forming a second redistribution layer over the first carrier substrate, the first redistribution layer being formed over the second redistribution layer, the second redistribution layer comprising a second dielectric layer and a second set of conductive vias, at least one of the second set of conductive vias being electrically coupled to at least one of the first set of conductive lines, the second redistribution layer being between the first integrated circuit die and the first redistribution layer.

19. The method of claim 18, wherein the second dielectric layer is made of a different material than the first dielectric layer.

20. The method of claim 15, wherein the substrate of the first interconnecting die is a silicon substrate.

* * * * *